United States Patent
Ker et al.

(10) Patent No.: US 6,765,771 B2
(45) Date of Patent: Jul. 20, 2004

(54) SCR DEVICES WITH DEEP-N-WELL STRUCTURE FOR ON-CHIP ESD PROTECTION CIRCUITS

(75) Inventors: Ming-Dou Ker, Hsinchu (TW); Hun-Hsien Chang, Taipei Hsien (TW); Wen-Tai Wang, Taipei (TW)

(73) Assignee: Taiwan Semiconductor Manufacturing Co., Ltd., Hsin-chu (TW)

(*) Notice: Subject to any disclaimer, the term of this patent is extended or adjusted under 35 U.S.C. 154(b) by 410 days.

(21) Appl. No.: 09/887,980

(22) Filed: Jun. 22, 2001

(65) Prior Publication Data

US 2002/0122280 A1 Sep. 5, 2002

(30) Foreign Application Priority Data

Mar. 5, 2001 (TW) .......................... 90105019 A

(51) Int. Cl.⁷ ................................. H02H 9/00

(52) U.S. Cl. .................. 361/56; 361/91.1; 361/111

(58) Field of Search ................ 361/56, 58, 91.1, 361/100, 117, 118, 127, 18, 111; 257/110, 355, 362, 356, 357

(56) References Cited

U.S. PATENT DOCUMENTS

| | | | | | |
|---|---|---|---|---|---|
| 5,728,612 | A | * | 3/1998 | Wei et al. ................... | 438/200 |
| 5,856,214 | A | * | 1/1999 | Yu .............................. | 438/133 |
| 5,959,332 | A | * | 9/1999 | Ravanelli et al. ........... | 257/360 |
| 6,365,940 | B1 | * | 4/2002 | Duvvury et al. ............ | 257/356 |

* cited by examiner

Primary Examiner—Stephen W. Jackson
(74) Attorney, Agent, or Firm—Thomas, Kayden, Horstemeyer & Risley

(57) ABSTRACT

An ESD protection component with a deep-N-well structure in CMOS technology and the relevant circuit designs are proposed in this invention. The ESD protection component comprises a lateral silicon controlled rectifier (SCR) and a deep N-well. The SCR comprises a P-type layer, an N-type layer, a first N-well and a first P-well. The P-type layer is used as an anode of the SCR; the N-type layer is used as a cathode of the SCR; the first N-well is located between the P-type layer and the N-type layer and is contacted with the P-type layer; and the first P-well is contacted to the first N-well and the N-type layer. The deep N-well is located between the first P-well and the P-substrate, and is used to isolate the electric connection between the P-substrate and the first P-well. A plurality of these ESD protection components arbitrarily connected in series increases the total holding voltage of ESD protection circuit, thus preventing occurrences of latch-up.

26 Claims, 25 Drawing Sheets

SCR DEVICES WITH DEEP-N-WELL STRUCTURE FOR ON-CHIP ESD PROTECTION CIRCUITS

BACKGROUND OF THE INVENTION

1. Field of the Invention

The present invention relates in general to a silicon-controlled rectifier, SCR, component with a deep N-well structure. In particular, the present invention relates to an SCR component of an electrostatic discharge (ESD) protection circuit.

2. Description of the Related Art

Electrostatic discharge (ESD) represents one of the main threats to reliability in semiconductor products, especially in scaled-down CMOS technologies. Due to low breakdown voltage of thinner gate oxide in deep-submicron CMOS technologies, an efficient ESD protection circuit must be designed and placed on every input pad to clamp the overstress voltage across the gate oxide of the internal circuit.

Due to the low holding voltage (Vhold, about 1V in CMOS process) of the SCR, power (Power=IESD×Vhold) generated by the SCR device during the ESD stress is less than other ESD protection devices (such as diode, MOS, BJT, or field-oxide device) in CMOS technologies. Therefore, the SCR device can sustain a much higher ESD level within a smaller layout area in the CMOS IC's. Thus, SCR devices have been used as the main ESD-clamped devices in several ESD protection circuits. In traditional CMOS technologies, well regions and heavy-doped diffusions are laterally deposited on a substrate to form an SCR device also known as lateral SCR (LSCR). The traditional input ESD protection circuit with the LSCR device is shown in FIG. 1a, and the device structure of the SCR device in CMOS process is shown in FIG. 1b. The PNPN structure of the LSCR is formed by the p+ diffusion 10, the N-type well 12, the P-type substrate 14 and the N+ diffusion 16. The typical I–V curve on the SCR device in CMOS process is shown in FIG. 1c. The LSCR devices in FIG. 1b have a trigger voltage $V_{trigger}$ approximately equal to the breakdown voltage of the P-N junction between the N-well 12 and the p-substrate 14, about 30~40V, which is generally greater than the gate-oxide breakdown voltage (15~20 volt) of CMOS devices. Therefore, SCR devices need a secondary protection ESD circuit (as the resistor and MESD shown in FIG. 1a) to ensure overall ESD protection.

In order to effectively protect output buffers by using SCR devices, an LVTSCR (low-voltage triggering SCR) device has been invented to lower the trigger voltage of the SCR device. The typical design for output ESD protection circuits with LVTSCR device is shown in FIG. 2a, and the device structure of the LVTSCR is shown in FIG. 2b. The I–V characteristics of the LVTSCR device in the submicron CMOS technology is illustrated in FIG. 2c. In FIG. 2c, the trigger voltage of the LVTSCR may be decreased to about 10V. In previous designs using SCR or LVTSCR devices, the body of the SCR or LVTSCR devices is the common p-substrate 14, which is commonly grounded, as shown in FIGS. 1b and 2b. Therefore, they serve only as routes from the input/output (I/O) pads to VSS or VDD power lines as I/O ESD protection circuits, or from VDD to VSS as a VDD-to-VSS ESD clamp circuit.

To provide high-noise immunity in analog or RF IC, a CMOS process often supports an additional deep N-well structure to isolate the P-well from the grounded p-substrate. Because noise generated from the digital circuits is often coupled into the common P-type substrate, signals in the high-performance analog circuits or the critical DRAM memory cells are easily affected by the coupled noises from the P-type substrate. To overcome the noise issue, a CMOS process often provides an additional deep N-well structure to isolate NMOS in the memory array from the periphery circuits. However, once the noise triggers the SCR and LVTSCR in FIGS. 1a and 2a, the signal voltage on the I/O pad will be latched up and the actual signals will not be detected correctly.

SUMMARY OF THE INVENTION

A novel object of the present invention is to provide a new SCR structure having the ability to be stacked in series.

Another object of the present invention is to protect IC from ESD stress at the input, output, or power pads and free from the latch-up issue.

According to the object described above, the present invention provides a novel ESD protection component, located on a P-substrate coupled to a relatively low-voltage power source. The ESD protection component comprises a lateral silicon controlled rectifier (SCR) and a deep N-well. The SCR comprises a P-type layer (as an anode of the SCR), an N-type layer (as a cathode of the SCR) a first N-well and a first P-well. The first N-well is located between the P-type layer and the N-type layer and is contacted with the P-type layer. The first P-well is contacted with the first N-well and the N-type layer. The deep N-well is located between the first P-well and the P-substrate, for isolating the electric connection between the P-substrate and the first P-well.

The present invention further provides an ESD protection circuit coupled between a first connection pad and a second connection pad. The ESD protection circuit comprises an ESD protection component having an anode and a cathode. The ESD protection component is located on a P-substrate coupled to a relatively low-voltage power source and comprises a lateral SCR and a deep N-well. The lateral SCR comprises: a P-type layer, as the anode of the SCR; an N-type layer, as the cathode of the SCR; a first N-well, located between the P-type layer and the N-type layer and contacted with the P-type layer; and a first P-well, contacted to the first N-well and the N-type layer. The deep N-well is located between the first P-well and the P-substrate for isolating the electric connection between the P-substrate and the first P-well. Wherein during an ESD event, the anode and the cathode are respectively connected to the first connection pad and the second connection pad.

The advantage of the present invention is that the deep N-well equivalently increases the resistor between the first p-well and the p-substrate. Moreover, after an appropriate design, the electric connection between the P-substrate and the first P-well is isolated. A plurality of the ESD components in the present invention can be connected to increase the total holding voltage, thereby preventing the latch-up event.

BRIEF DESCRIPTION OF THE DRAWINGS

The present invention can be more fully understood by reading the subsequent detailed description in conjunction with the examples and references made to the accompanying drawings, wherein:

FIG. 1b is a cross-sectional diagram of the LSCR device structure shown in FIG. 1a;

FIG. 1c is the IV curve of the LSCR of FIG. 1a;

FIG. 2b is a cross-sectional diagram of the LVTSCR device in FIG. 2a;

DETAILED DESCRIPTION OF THE PREFERRED EMBODIMENT

The embodiments described below utilize a deep N-well and a common P-substrate to implement the present invention. The embodiments utilizing a deep P-well and a common N-substrate according to the present invention are familiar to those in the art after reading this specification and are not repeated here.

The First Embodiment

Figure 3A:
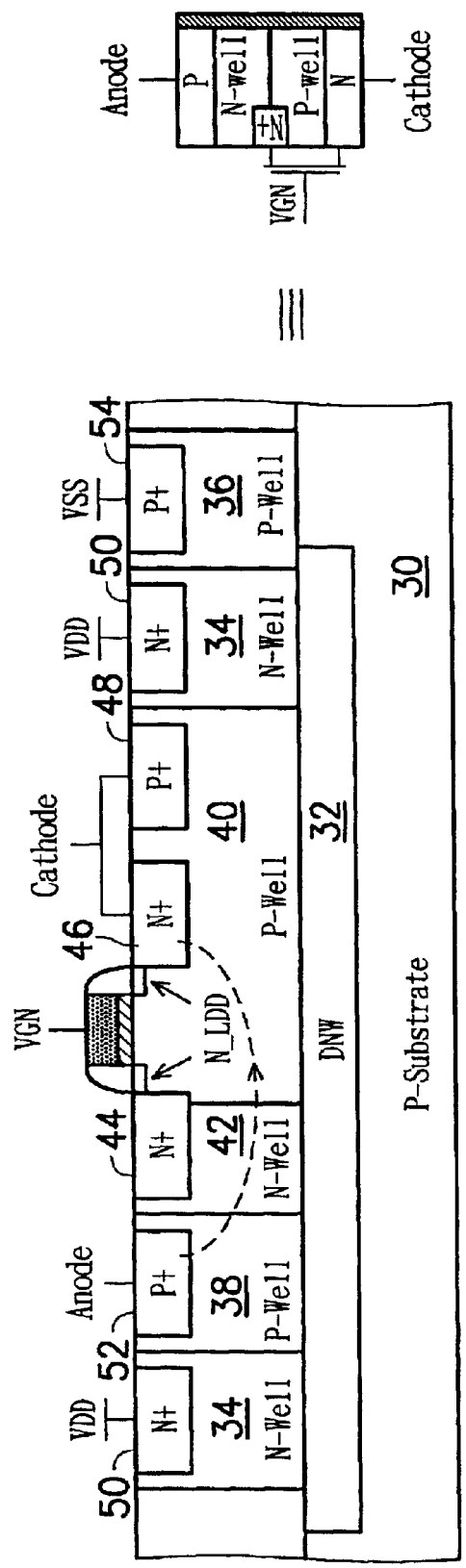
FIGS. 3a and 3b show the cross-sectional diagrams and the symbols defined of the NSCR devices of the present invention.

The device structure of the proposed N-type SCR devices with the deep N-well region is shown in FIG. 3a, where a novel symbol is defined in the right-hand side for the following circuit design. The N-type SCR device (hereinafter described as NSCR) has three nodes: the anode, the cathode and the gate ($V_{GN}$). The PNPN structure of the NSCR is comprised of a P-well 38, an N-well 42, a P-well 40 and an N+ diffusion 46, wherein the P-well 38 and the P+ diffusion 52 are the anode of the NSCR. The P-well 40 is isolated from the common P-substrate 30 by a deep N-well 32 under the whole NSCR device. An NMOS is inserted into the P-well 40 of the NSCR device. The drain of the NMOS is formed by an N+ diffusion 44 across the P-N junction between the N-well 42 and the P-well 40. The source of the NMOS is the N+ diffusion 46, which is also the cathode of the NSCR device. The deep N-well region 32 is placed between the whole PNPN structure and the P-substrate 30, and is biased at VDD through the connection of the N-well 34. In a practical layout, the N-well 34 connected to VDD usually encloses the whole NSCR device. The P-substrate 30 is connected to VSS through the P-well 36 and the p+ diffusion 54. Thereby, the body of the NSCR device is fully isolated from the p-substrate 30.

Figure 1A:
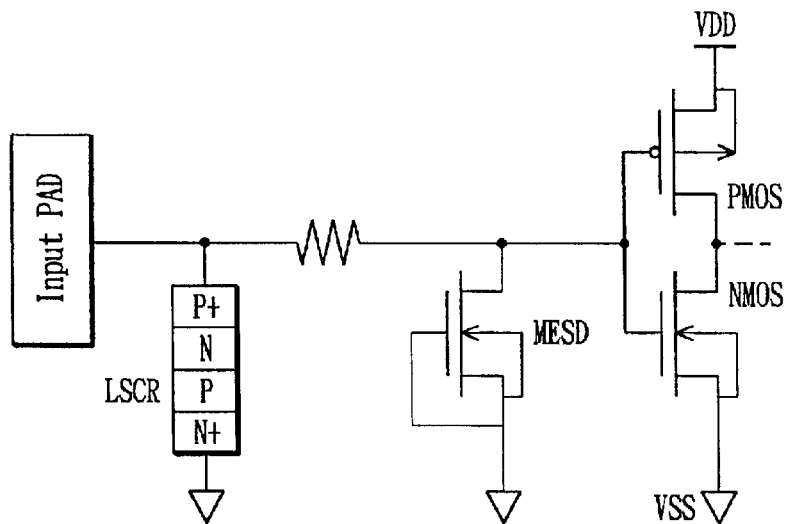
FIG. 1a is a traditional input ESD protection circuit with the LSCR circuit as the main ESD protection component.
Figure 1B:
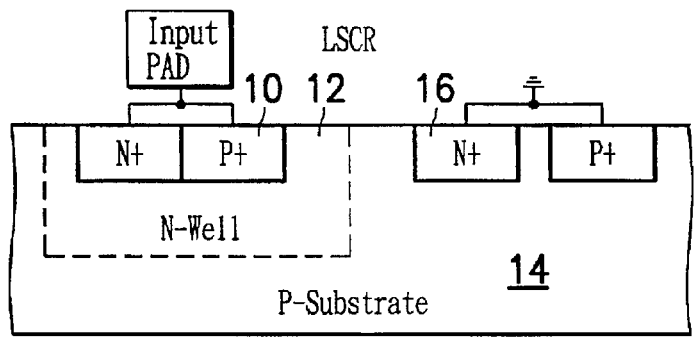
Figure 1C:
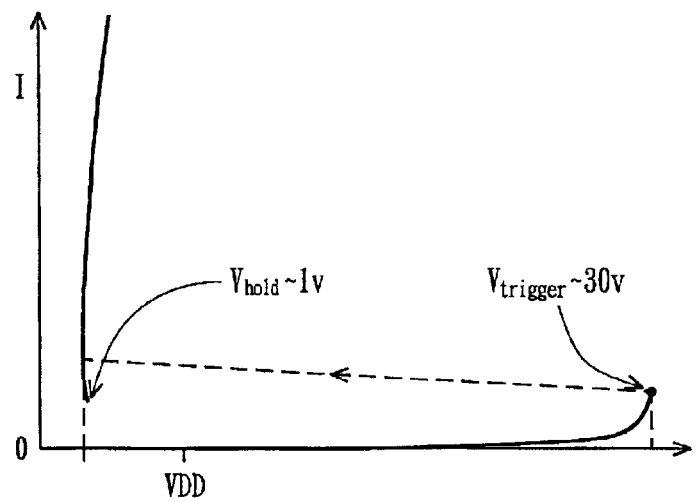
Figure 2A:
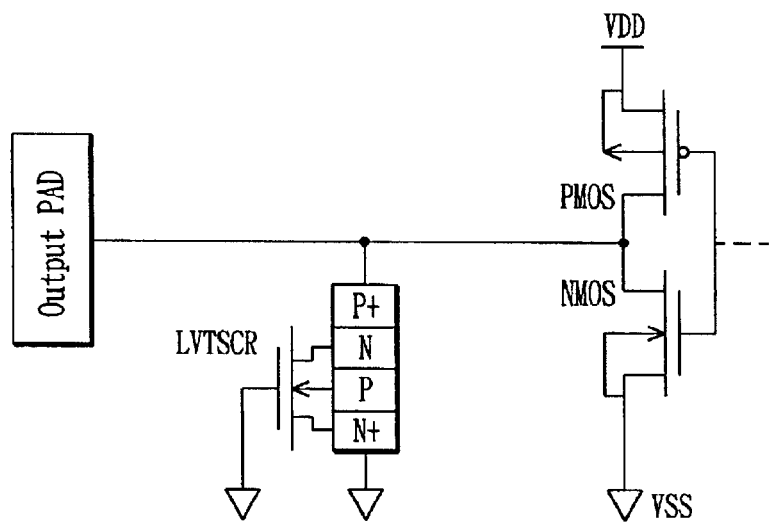
FIG. 2a is the typical design of an ESD protection circuit with the LVTSCR device.
Figure 2B:
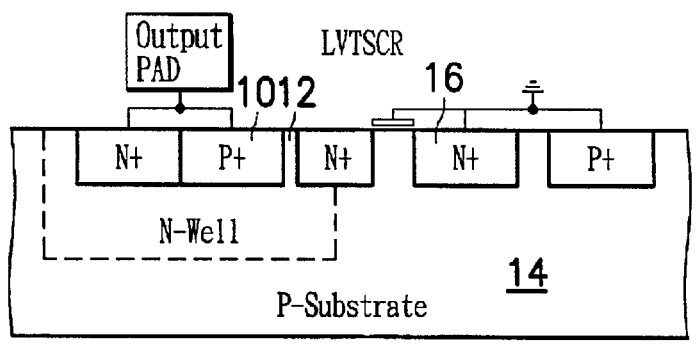
Figure 2C:
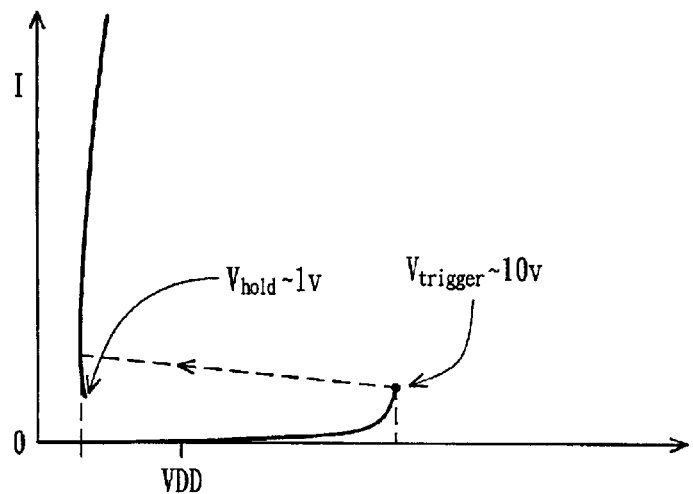
FIG. 2c is the IV curve of the LVTSCR in FIG. 2b

The gate of the NMOS is used as the control gate (VGN). When a positive voltage is applied to this gate, the NMOS is turned on to conduct the trigger current into the p-well 40. The trigger current into the p-well 40 will fire the latch-up positive-feedback regeneration process to turn on the SCR device. The voltage difference between the anode and the cathode is kept at the holding voltage (~1V). The conducting path in the SCR device is shown by the dashed line in FIG. 3a. Because the body (p-well 40) is isolated from the P-substrate 30 by the deep N-well 32, the trigger current (from the N+ diffusion 44 of the turned-on NMOS) into the p-well 40, is not diverted. Therefore, the proposed N-type SCR provides much faster and efficient turn-on for ESD protection purposes. In the traditional LVTSCR device in FIG. 2b, the body of the LVTSCR is the common P-substrate 14. When the NMOS is turned on to generate the trigger current into the p-substrate 14 of the traditional LVTCSR device, the trigger current is diverted into the whole p-substrate. This is a main difference between the proposed NSCR with the deep N-well structure and the traditional LVTSCR device. With the isolated body, the trigger current is not diverted into the p-substrate, therefore the trigger current flows in the p-well to trigger the NSCR device earlier. This proposed NSCR device with the deep N-well structure is therefore more quickly turned on than traditional LVTSCR devices with the common p-substrate. Because the ESD events often have very fast electrical transitions in the order of several nanoseconds (ns), the ESD protection device used to bypass the ESD current must be turned on as quickly as possible to discharge the ESD current. The proposed SCR device has a faster turn-on speed, which is more suitable for ESD application.

Figure 3B:
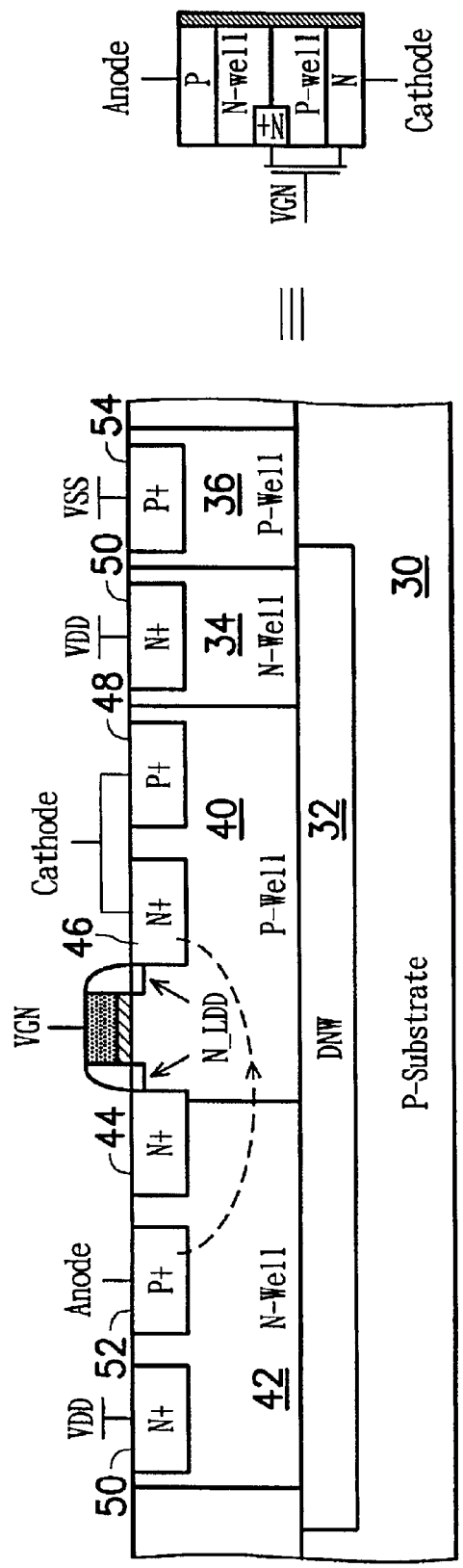

Similar to FIG. 3a, FIG. 3b is the other embodiment of the NSCR device of the present invention, where a novel symbol is defined in the right-hand side for the following circuit design. The P-well 38 in FIG. 3a is replaced by the N-well 42 in FIG. 3b. Therefore, the P+ diffusion 52 (the anode) is formed in the N-well 42. The PNPN structure of the NSCR is composed of a P+ diffusion 52, an N-well 42, a P-well 40 and an N+ diffusion 46. The P+ diffusion 52 is isolated from the P-substrate 30 by the N-well 42, therefore, seeing the left-hand side of FIG. 3b, the N+ diffusion 50, the N-well 34 and the corresponding VDD contact can be omitted without affecting the embodiment of the present invention.

The Second Embodiment

Figure 4A:
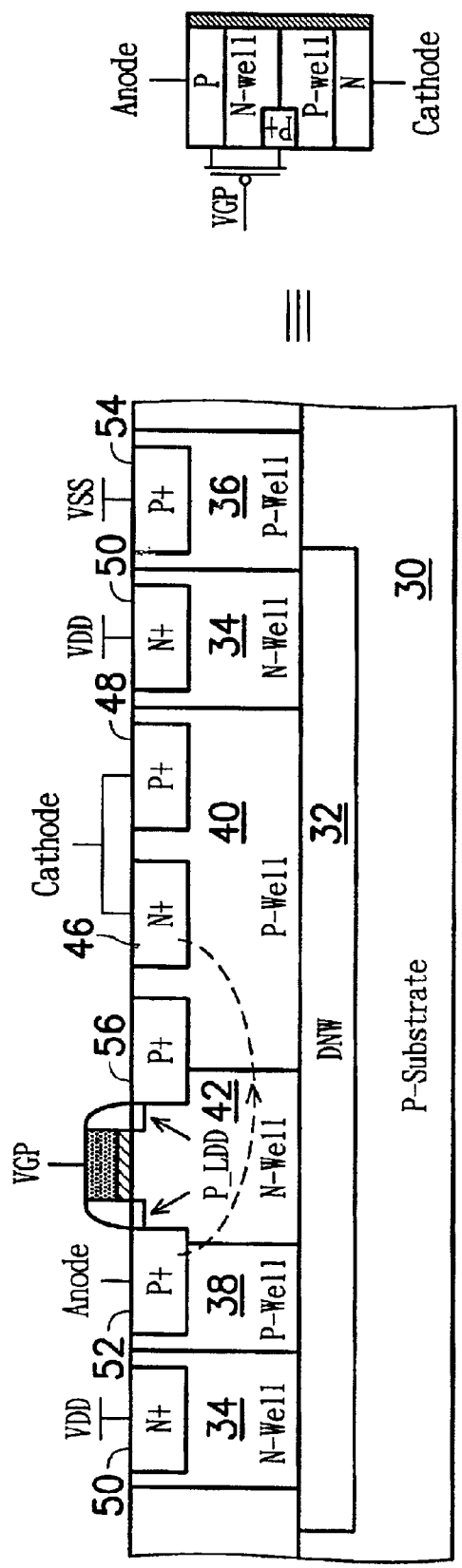
FIGS. 4a and 4b show the cross-sectional diagrams and the symbols defined of the PSCR devices of the present invention.

Based on the same concept, a P-type SCR device (herein described as PSCR) with the deep N-well structure can be built in FIG. 4a, where a symbol shown in the right-hand side is used to represent this PSCR device. This P-type device has three nodes: the anode, the cathode and the control gate (VGP). The PNPN structure of the PSCR comprises P-well 38, N-well 42, P-well 40 and the N+ diffusion 46. The P-well 40 is isolated from the grounded P-substrate 30 with a deep N-well 32. There is a PMOS in the N-well 42. The source (the P+ diffusion 52) of the inserted PMOS in the PSCR structure is also as the anode of the PSCR device. The drain of the PMOS formed by the P+ diffusion 56 across the PN junction between the N-well 42 and the P-well 40. The P-well 40 is coupled to the cathode through the P+ diffusion 48. The deep N-well 32 formed between the whole PNPN structure and the P-substrate 30 is connected to VDD through the N-well 34 which in the practical layout encloses the whole PSCR component. The P-substrate 30 is connected to VSS through the P-well 36 and the P+ diffusion 54. Therefore, the body of the PSCR device is electrically floated on the grounded P-type substrate 30. When a relatively negative voltage is applied to this gate, the PMOS will be turned on to conduct the trigger current into the P-well 40. The trigger current into the P-well will fire the latch up positive-feedback regeneration process to turn on the SCR device. The current conducting path in the PSCR device is shown by the dashed line in FIG. 4a. With the isolated body in the PSCR device, the trigger current generated from the PMOS is not diverged into the common P-substrate 30, which is the main difference between this proposed PSCR with the deep N-well structure and the traditional LVTSCR device. Therefore, the PSCR can be turned on more quickly for effective ESD protection.

Figure 4B:
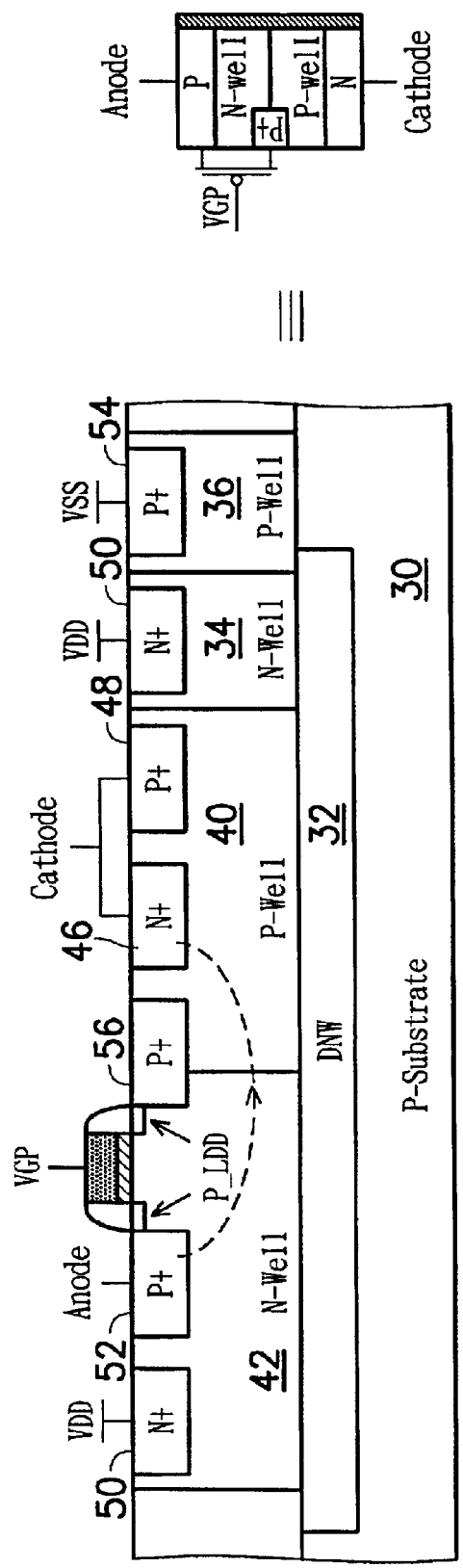

Similarly to FIG. 4a, FIG. 4b is another embodiment of the PSCR device of the present invention, where a symbol is defined at the right hand side for the following circuit design. The P-well 38 in FIG. 4a is encroached and replaced by the N-well 42 in FIG. 4b. Therefore, the P+ diffusion 52, as the anode, is formed inside the N-well 42. The PNPN structure of the PSCR device is comprised of P+ diffusion 52, an N-well 42, a P-well 40 and an N+ diffusion 46. The P+ diffusion 52 is isolated by the N-well 42, such that, as shown on the left side of FIG. 4b, the heavy-doped N+ diffusion 50, the N-well 34 and the corresponding VDD contact can be omitted without affecting the embodiment of the present invention.

The Third Embodiment

Figure 5:
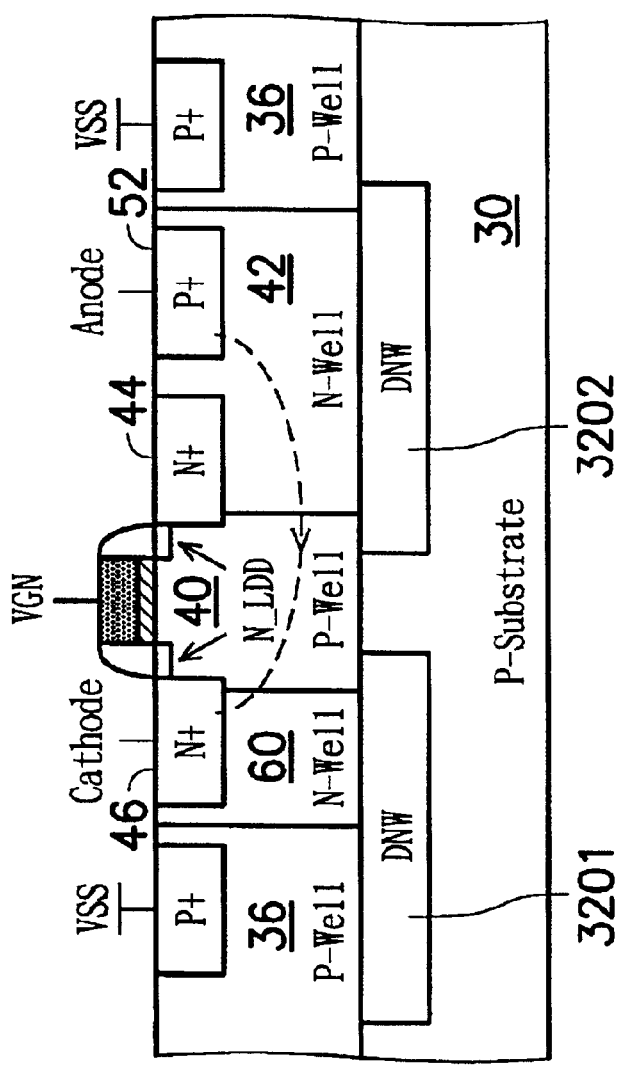
FIG. 5 shows another NSCR device of the present invention.

The modified embodiment of the NSCR device with a deep N-well is shown in FIG. 5. There are three nodes in the NSCR structure: the anode, the cathode and the control gate (VGN). The PNPN structure of the NSCR is composed of the P+ diffusion 52, the N-well 42, the P-well 40 and the N+ diffusion 46. The P+ diffusion 52 is used as the anode of the NSCR device and an NMOS is inserted into the P-well 40. The drain of the NMOS is formed by the N+ diffusion 44 at the P-N junction of the P-well 40 and the N-well 42. The source of the NMOS is formed by the N+ diffusion 46, used as the cathode of the NMOS device. In this modified device structure, the P-well 40 of the NSCR device is partially connected to the common P-substrate 30. But the two deep N-well regions 3201 and 3202 are placed closer to limit the connection region of the P-well 40 and the P-substrate 30, thereby increasing the equivalent resistance between them. The deep N-well 3201 is connected to N-well 60, the deep N-well 3202 is connected to N-well 42. When proper voltage is applied to the control gate VGN, the trigger current from the NMOS into the P-well 40 turns on the NSCR more quickly within the limited connection region. The current path of the NSCR device is shown by the dashed line in FIG. 5.

The Fourth Embodiment

Figure 6:
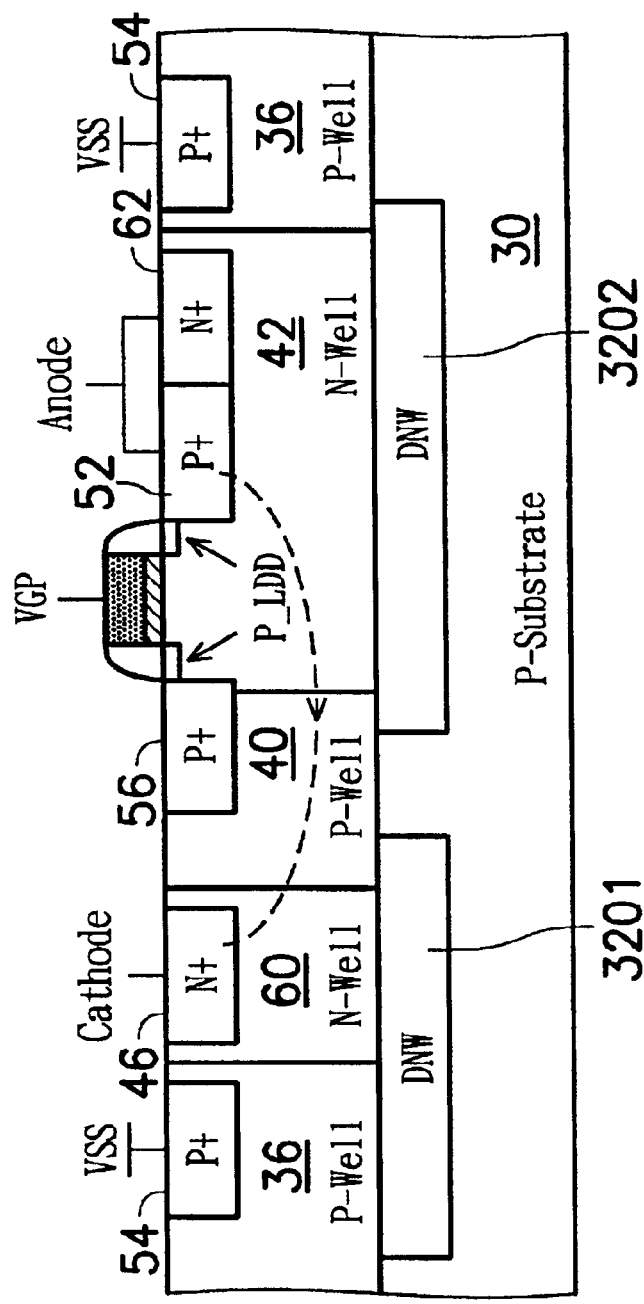
FIG. 6 shows another NSCR device of the present invention.

The modified device structure of the PSCR device with a deep N-well is shown in FIG. 6. In this modified PSCR structure, there are three nodes: the cathode, the anode and the control gate VGP. The PNPN structure of the PSCR device is formed by a P+ diffusion 52, an N-well 42, a P-well 40 and an N-well 60 (or an N+ diffusion 46), wherein the P+ diffusion 52 is used as the anode of the PSCR device. A PMOS is inserted into the N-well 42. The drain of the PMOS is formed by the P+ diffusion 56 at the P-N junction between the P-well 40 and the N-well 42. The source of the PMOS is formed by the P+ diffusion 52, which is also the anode of the PSCR device. In this modified device structure, the P-well 40 is partially connected to the common P-substrate 30. But, the two deep N-well regions 3201 and 3202 are placed closer to limit the connection region of the P-well 40 and the P-substrate 30. The deep N-well 3201 is connected to the N-well 60 and the deep N-well 3202 is connected to the N-well 42. With the limited connection region, the equivalent resistance between the P-well 40 and the P-substrate 30 can be increased. Thereby, the trigger current from the PMOS into the P-well 40 can turn on the PSCR device more quickly.

The current path of the PSCR device is shown by the dashed line in FIG. 6. When the control gate VGP is suitably biased, the proposed PSCR device can be triggered on more quickly than the traditional LVTSCR device for more effective ESD protection applications.

The Fifth Embodiment

Figure 7:
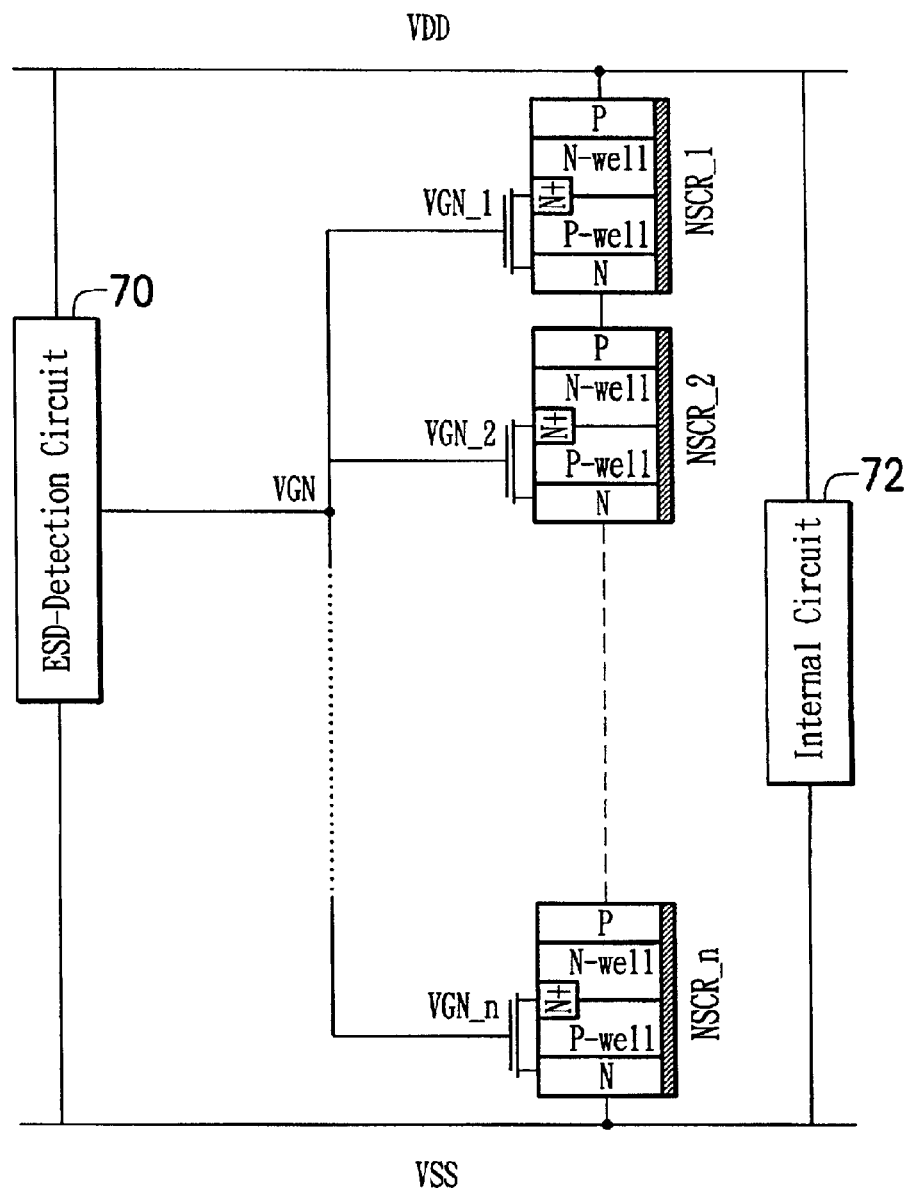
FIG. 7 shows the VDD-to-VSS ESD clamp circuit with the proposed NSCR device of the present invention.

The VDD-to-VSS ESD clamp circuit with the proposed NSCR device is conceptually shown in FIG. 7, where the control gates of the forward-stacked NSCR (NSCR_1, NSCR_2 . . . SCR_n) are connected together and are driven by an ESD-detection circuit 70. When an ESD pulses across VDD and VSS power rails, the ESD-detection circuit 70 detects the event and sends out a high voltage to the control gate VGN to turn on the stacked N-type SCR devices NSCR_1~NSCR_n. The stacked NSCR devices from VDD to VSS are used to prevent the latch-up problem in CMOS IC. The forward-stacked NSCR devices NSCR_1~NSCR_n can be regarded as a big NSCR device with a holding voltage $V_{hold\text{-}total}$, equivalent to the sum of the holding voltages of all the stacked NSCR devices. Therefore, as long as the $V_{hold\text{-}total}$ is greater than the voltage difference between VDD and VSS during normal operating conditions, the NSCR device will not be turned on to cause latch-up problems. Presuming the NSCRs are identical, the number of the NSCR devices in the forward-stacked NSCR configuration for VDD-to-VSS ESD clamp circuit without the latch-up problem can be calculated as:

$$n \geq (VDD-VSS)/V_{hold\text{-}NSCR};$$

wherein the $V_{hold\text{-}NSCR}$ (about 1V~2V) is the holding voltage of a single NSCR device, and n is the number of total NSCR devices in the forward-stacked SCR configuration.

Figure 8:
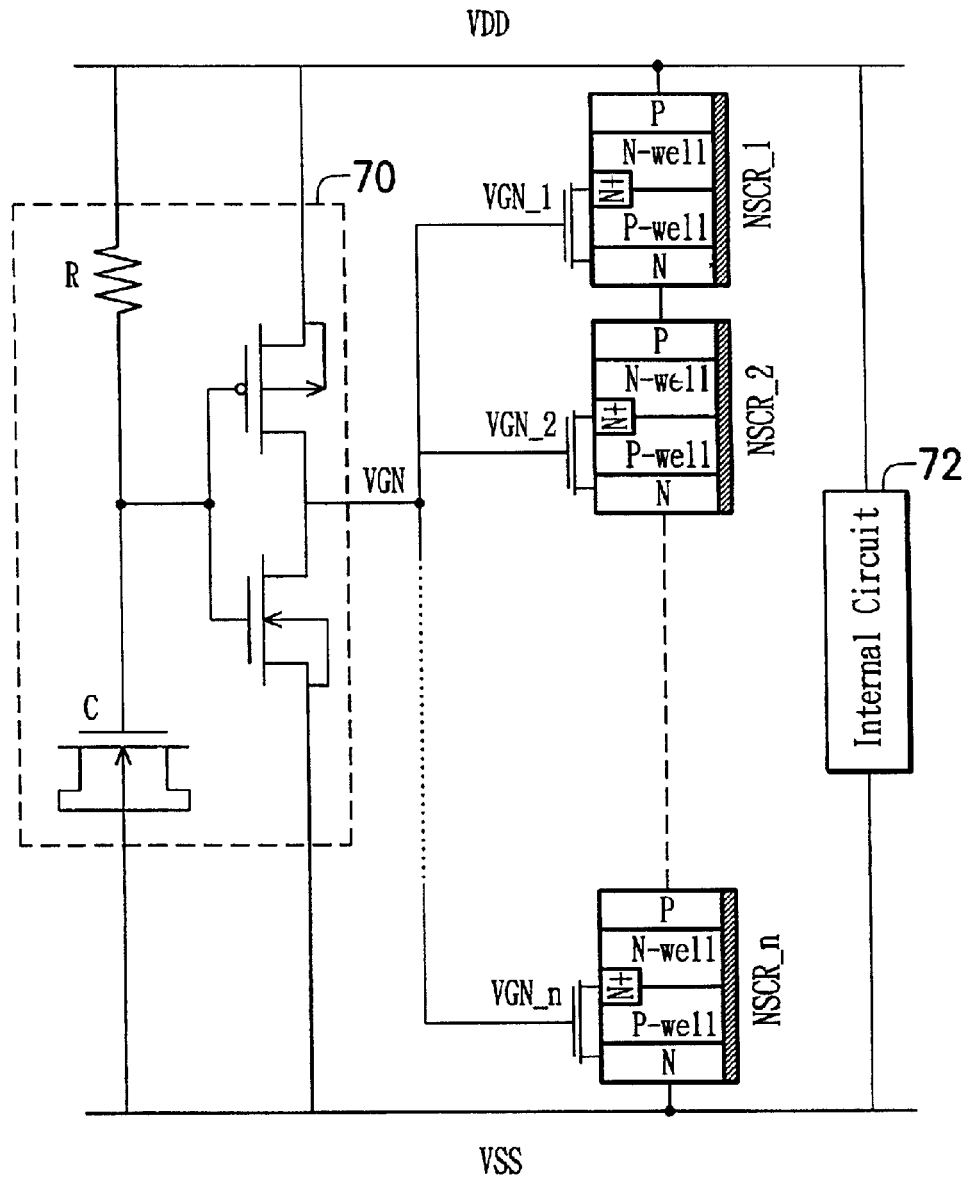
FIG. 8 is an example showing the ESD-detection circuit in FIG. 7.

A circuit design example to realize the ESD-detection circuit of FIG. 7 is shown in FIG. 8, where a RC delay circuit is used to distinguish the ESD event or VDD power-up event across VDD and VSS power lines. The CMOS inverter is configured as a driver. During normal operating conditions, the RC circuit initially keeps the input node of the inverter of the ESD circuit at a high-voltage level, therefore the CMOS inverter generates a low voltage output to turn off all the NMOS in the NSCR devices. In the event of an ESD, the RC circuit initially keeps the input node of the inverter of the ESD-detection circuit at a low level, and the inverter biased by the ESD energy well generates a high voltage output to the control gate VGN to simultaneously turn on the stacked NSCR devices. The ESD across the power rail is thus discharged through the turned-on stacked NSCR devices. To distinguish the ESD from normal operating conditions, the RC time constant is about 0.1~1 s.

The Sixth Embodiment

Figure 9:
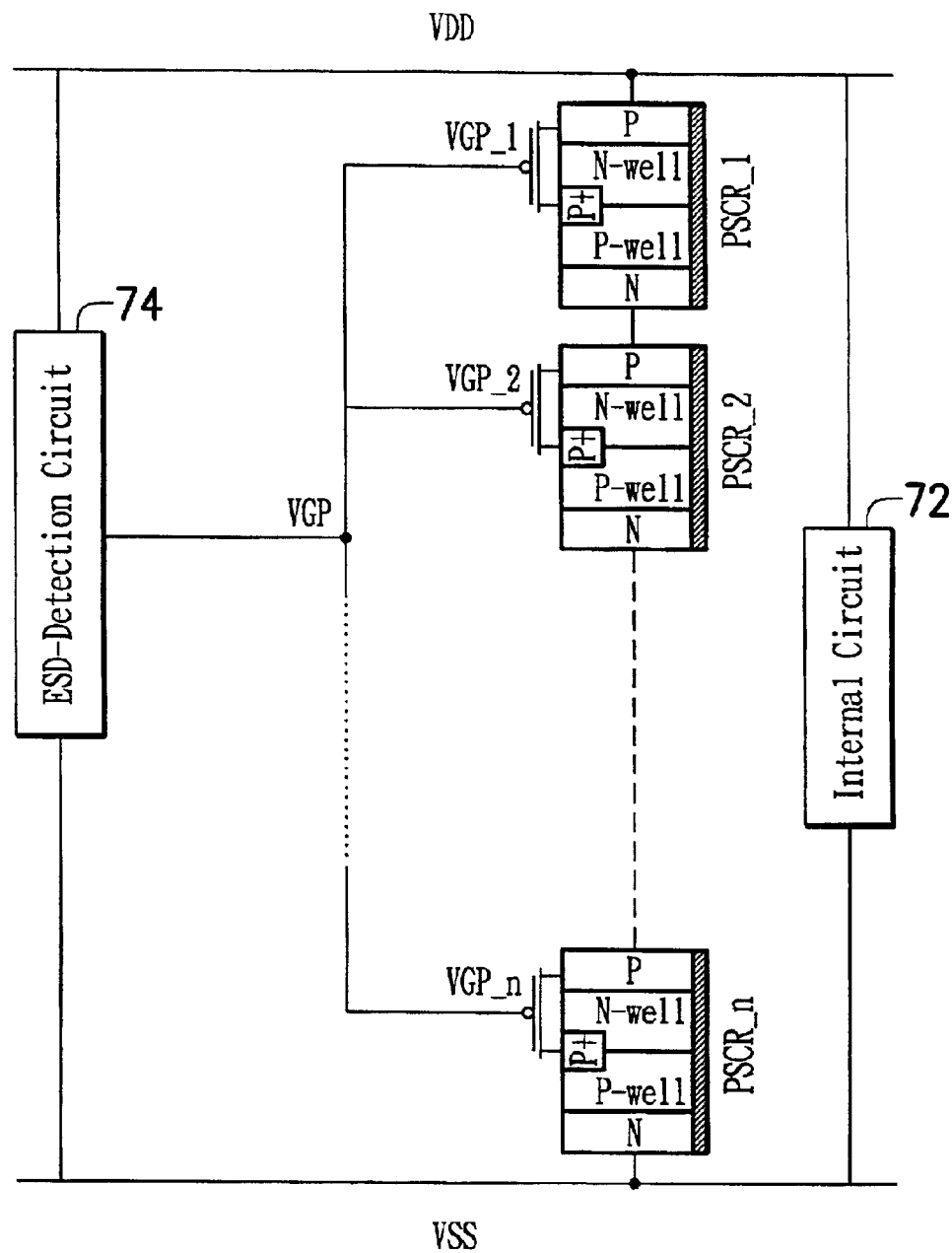
FIG. 9 shows a VDD-to-VSS ESD clamp circuit with the proposed PSCR device of the present invention.

The PSCR device can be also applied in the VDD-to-VSS ESD clamp circuit, such as that shown in FIG. 9. The control gates of the forward-stacked PSCRs (PSCR_1, PSCR_2 . . . PSCR_n) are connected together and are driven by an ESD-detection circuit 74. When an ESD pulses across VDD and VSS power rails, the ESD-detection circuit 74 detects the ESD event and send out a low voltage to the control gate VGP to turn on the stacked PSCRs (PSCR_1~PSCR_n).

Figure 10:
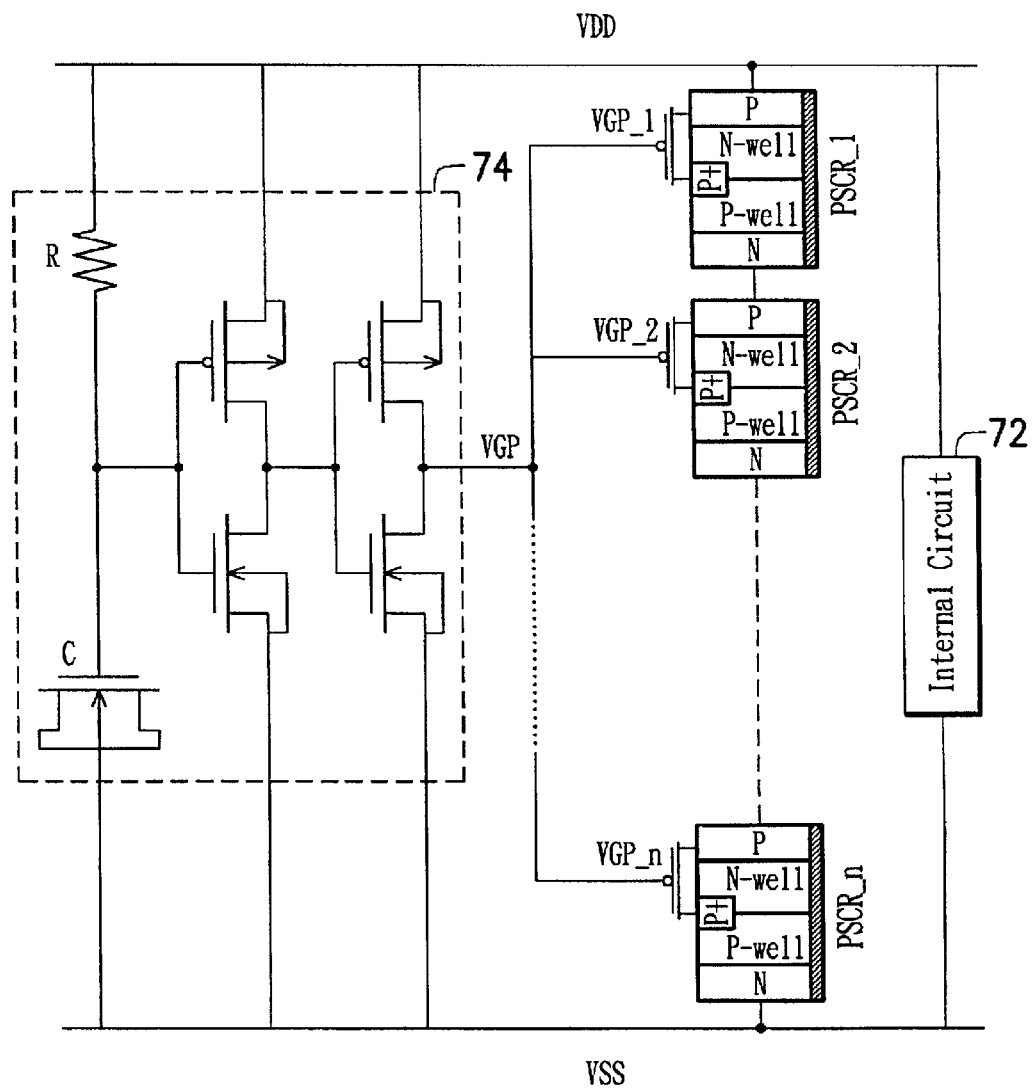
FIG. 10 is an example showing the ESD-detection circuit in FIG. 9.

A circuit design example to realize the ESD-detection circuit of FIG. 9 is shown in FIG. 10, where an RC delay circuit is used to distinguish an ESD or a power-up event across VDD and VSS power lines. The CMOS inverters are configured as a driver. Under normal operating conditions, the RC circuit initially keeps the input node of the inverter of the ESD-detection circuit at a high-voltage level, and the driver generates a high voltage output to turn off all the PMOS in the PSCR devices. In the event of an ESD, the RC delay circuit initially keeps the input node of the driver of the ESD-detection circuit at a low level, and, the driver biased by the ESD energy generates a low voltage output to the control gate VGP to simultaneously turn on the stacked PSCR devices. The ESD across the power rail is then discharged through the turn-on stacked PSCR devices. To distinguish an ESD event from normal operating conditions, the RC time constant is about 0.1~1 s.

The Seventh Embodiment

Figure 11:
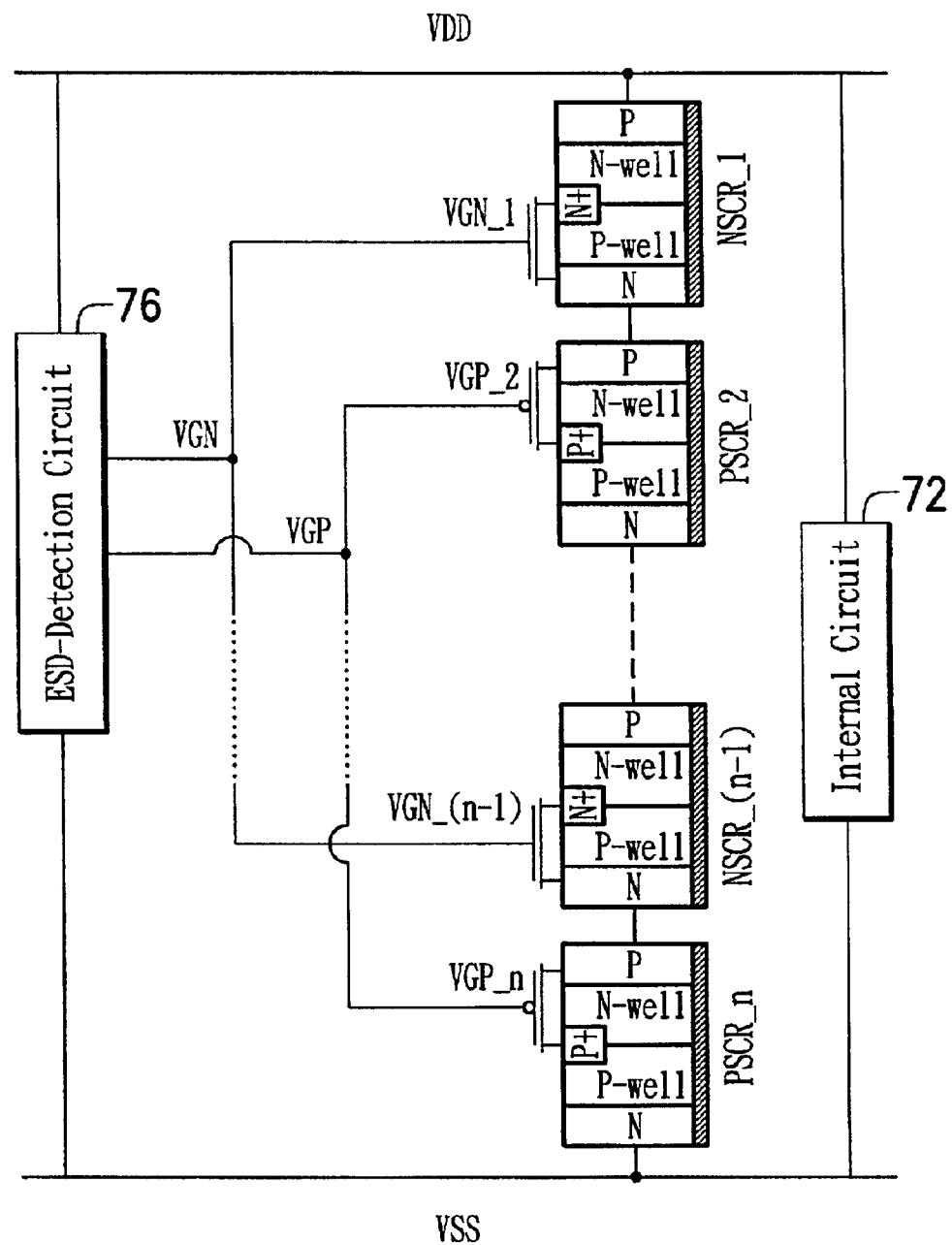
FIG. 11 shows the embodiment with mixed design of the proposed NSCR and PSCR devices in stacked configuration.

A more complex design by using the mixed NSCR and PSCR devices in a stacked configuration in the VDD-to-VSS ESD clamp circuit is shown in FIG. 11, where the ESD-detection circuit 76 has two output nodes to bias VGN and VGP, separately. During normal operation condition, the ESD-detection circuit 76 generates a high voltage output to all the control gates VGP of the PSCR devices and a low voltage output to all the control gates VGN of the NSCR devices. When an ESD occurs across VDD and VSS power lines, the ESD protection circuit generates a low voltage output to the control gates VGP of the PSCR devices to turn on the PSCR devices, and a high voltage output to the control gates VGN of the NSCR devices to turn on the NSCR devices.

The Eighth Embodiment

Figure 12:
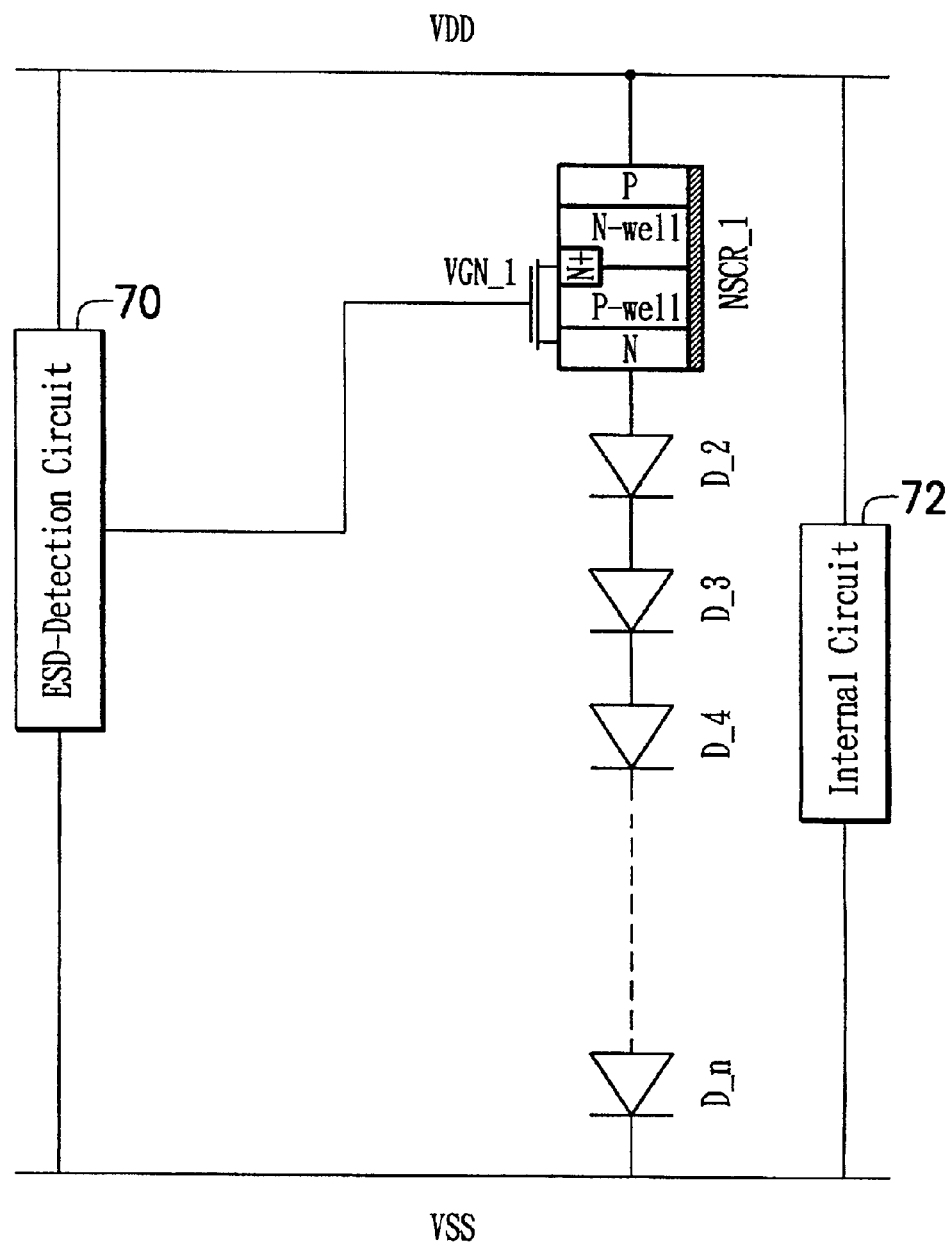
FIGS. 12 and 13 show the VDD-to-VSS ESD clamp circuit with the proposed NSCR equipped with diodes in stacked configuration.
Figure 13:
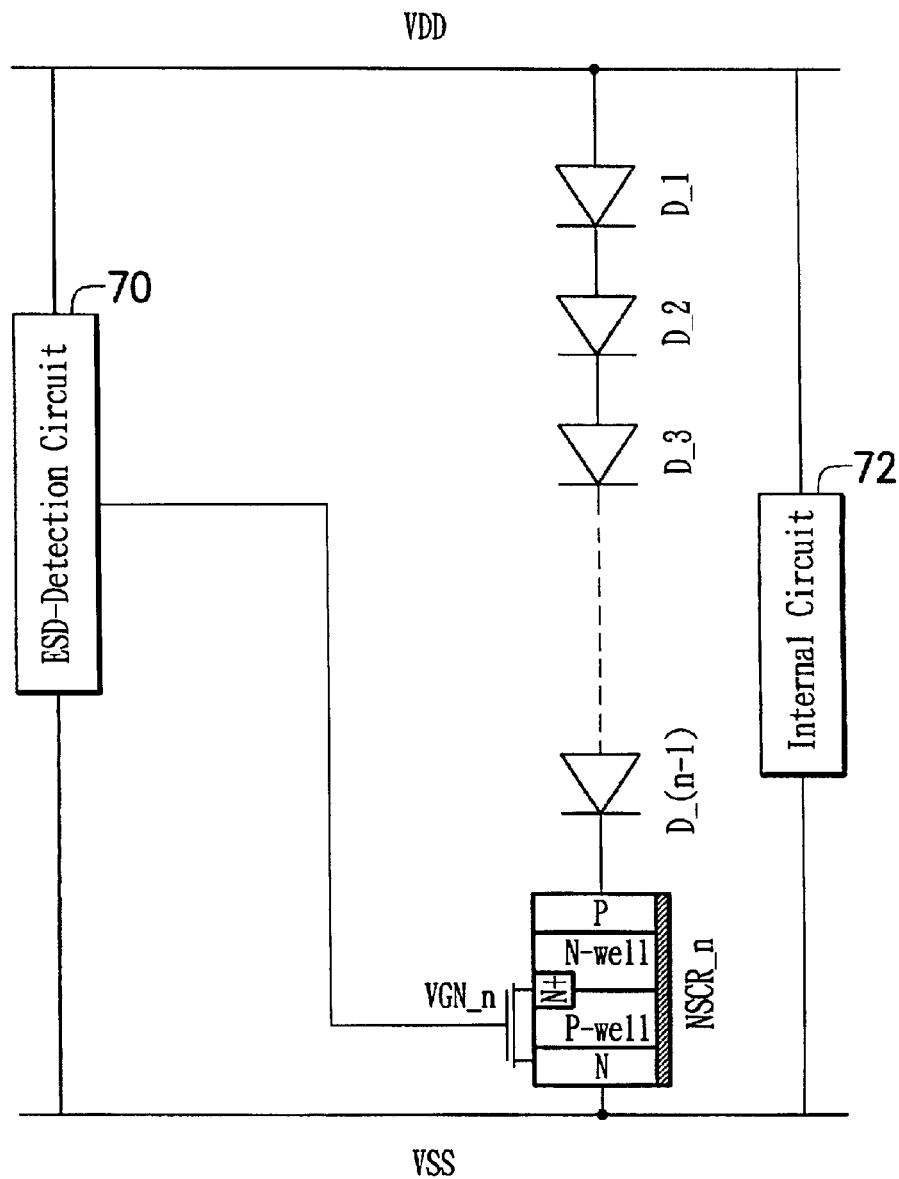

This proposed NSCR can also be equipped with the diodes in the stacked configuration to overcome the latch-up problem. The design example is shown in FIGS. 12 and 13, where a single NSCR is stacked with multiple diodes to increase the total holding voltage greater than VDD-to-VSS voltage level. This NSCR, biased by the ESD-detection circuit 70 can be inserted in any position among the diodes. For example, the NSCR biased by the ESD-detection circuit is placed at the top of the stacked configuration (in FIG. 12), or at the bottom of the stacked configuration (in FIG. 13). During an ESD event, the ESD-detection circuit 70 generates a high voltage output to turn on the NMOS of the NSCR devices.

The Ninth Embodiment

Figure 14:
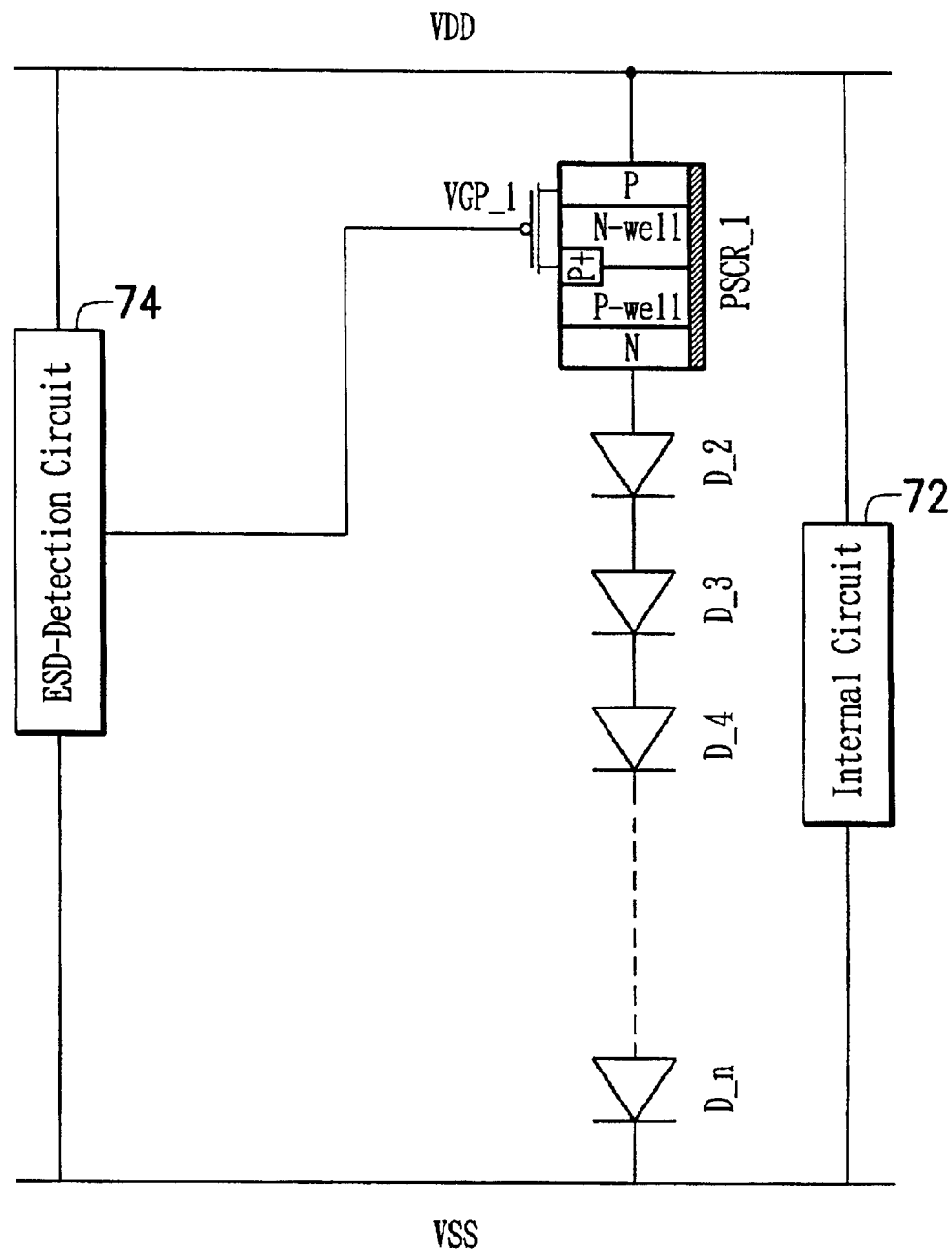
FIGS. 14 and 15 show the VDD-to-VSS ESD clamp circuit with the proposed PSCR equipped with diodes in stacked configuration.
Figure 15:
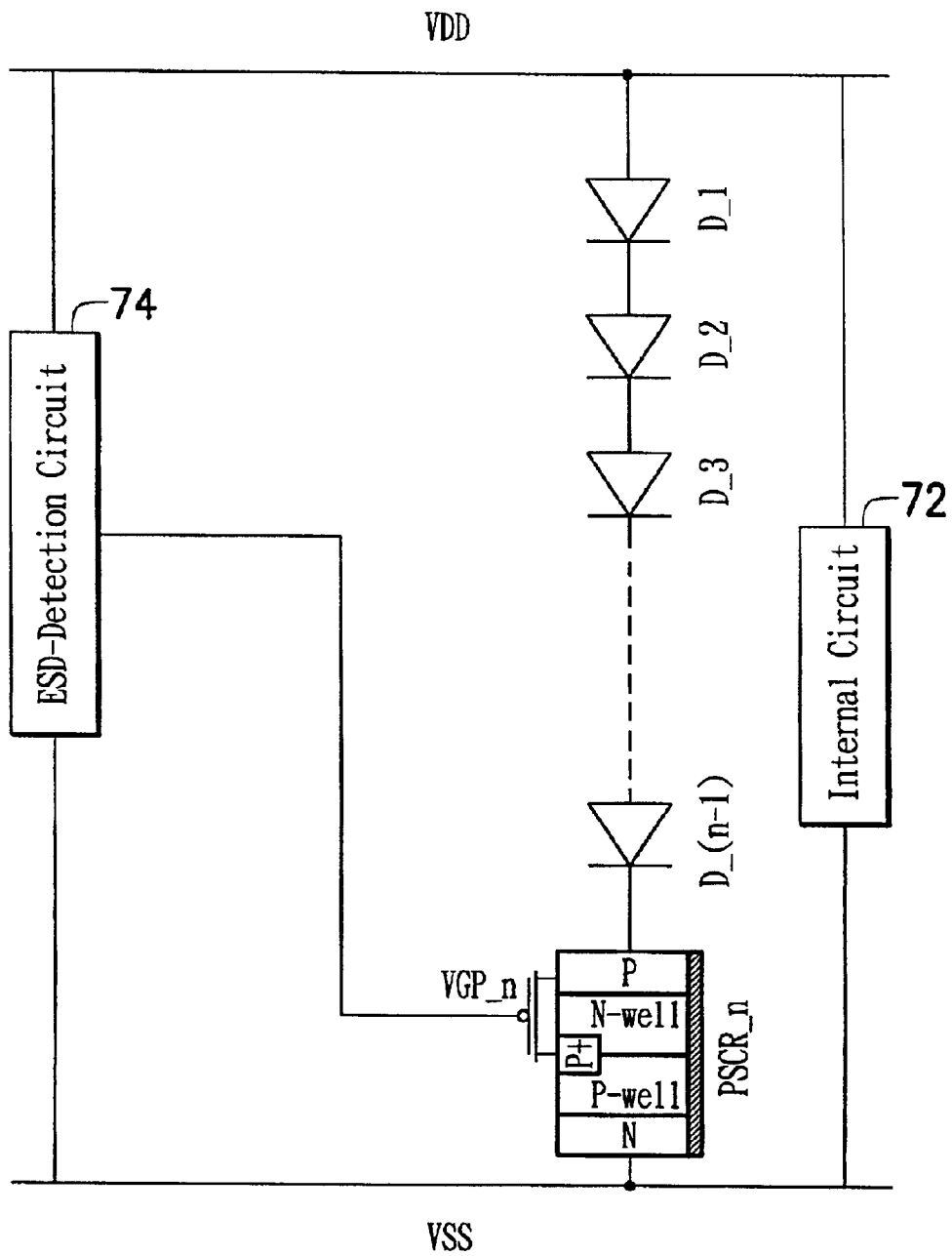

This proposed PSCR can be also cooperated with the diodes in the stacked configuration to overcome the latch-up problem. The design example is shown in FIGS. 14 and 15, where a single PSCR is stacked with the multiple diodes to increase the total holding voltage greater than VDD-to-VSS voltage level. This PSCR biased by the ESD-detection circuit 74 can be inserted in any position among the diodes. For example, the PSCR biased by the ESD-detection circuit is placed at the top of the stacked configuration (in FIG. 14), or at the bottom of the stacked configuration (in FIG. 15). During an ESD event, the ESD-detection circuit 74 generates a low voltage output to turn on the PMOS of the PSCR devices.

The Tenth Embodiment

Figure 16:
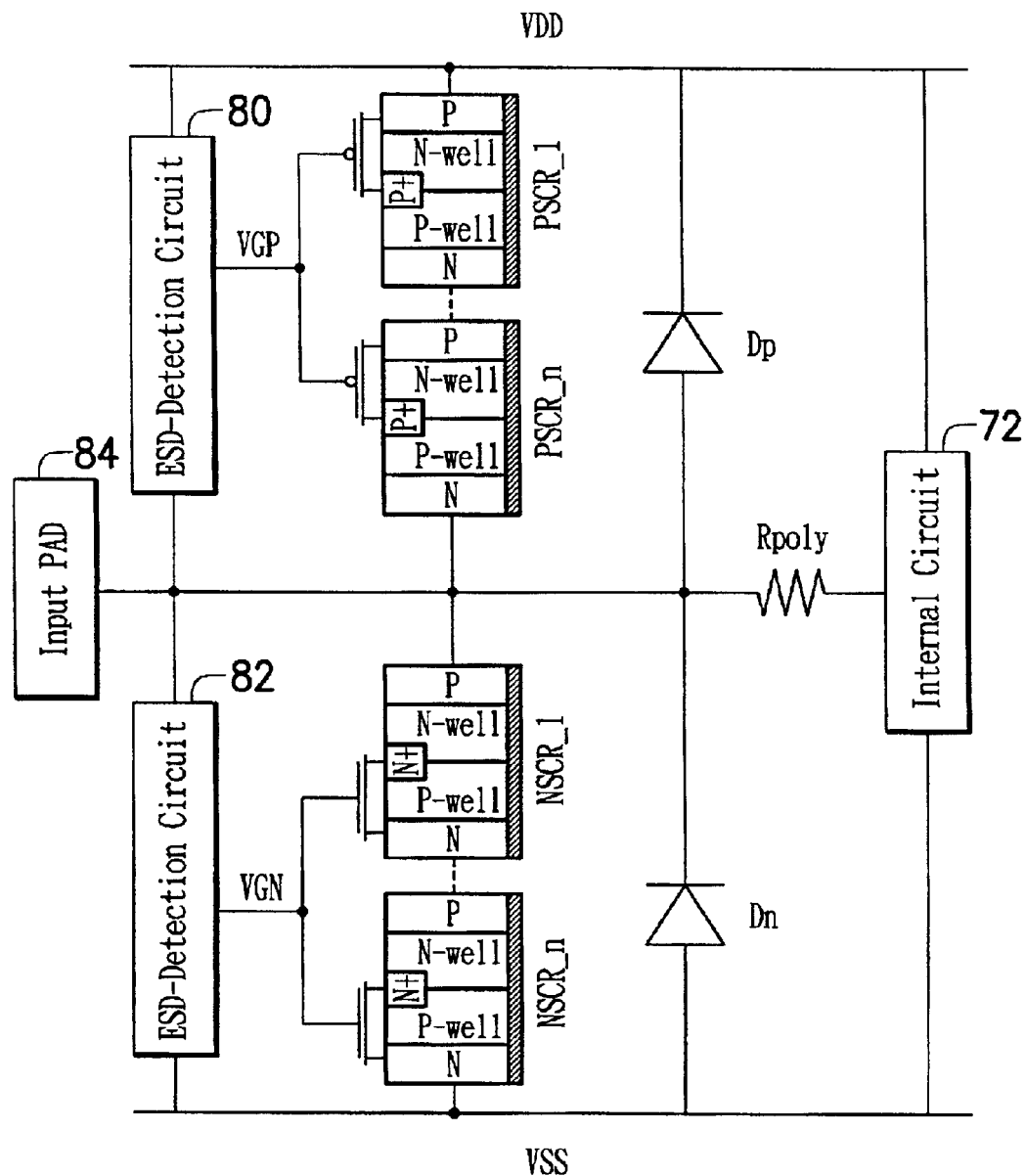
FIG. 16 shows the proposed NSCR and PSCR devices applied to the input ESD protection circuit.
Figure 17:
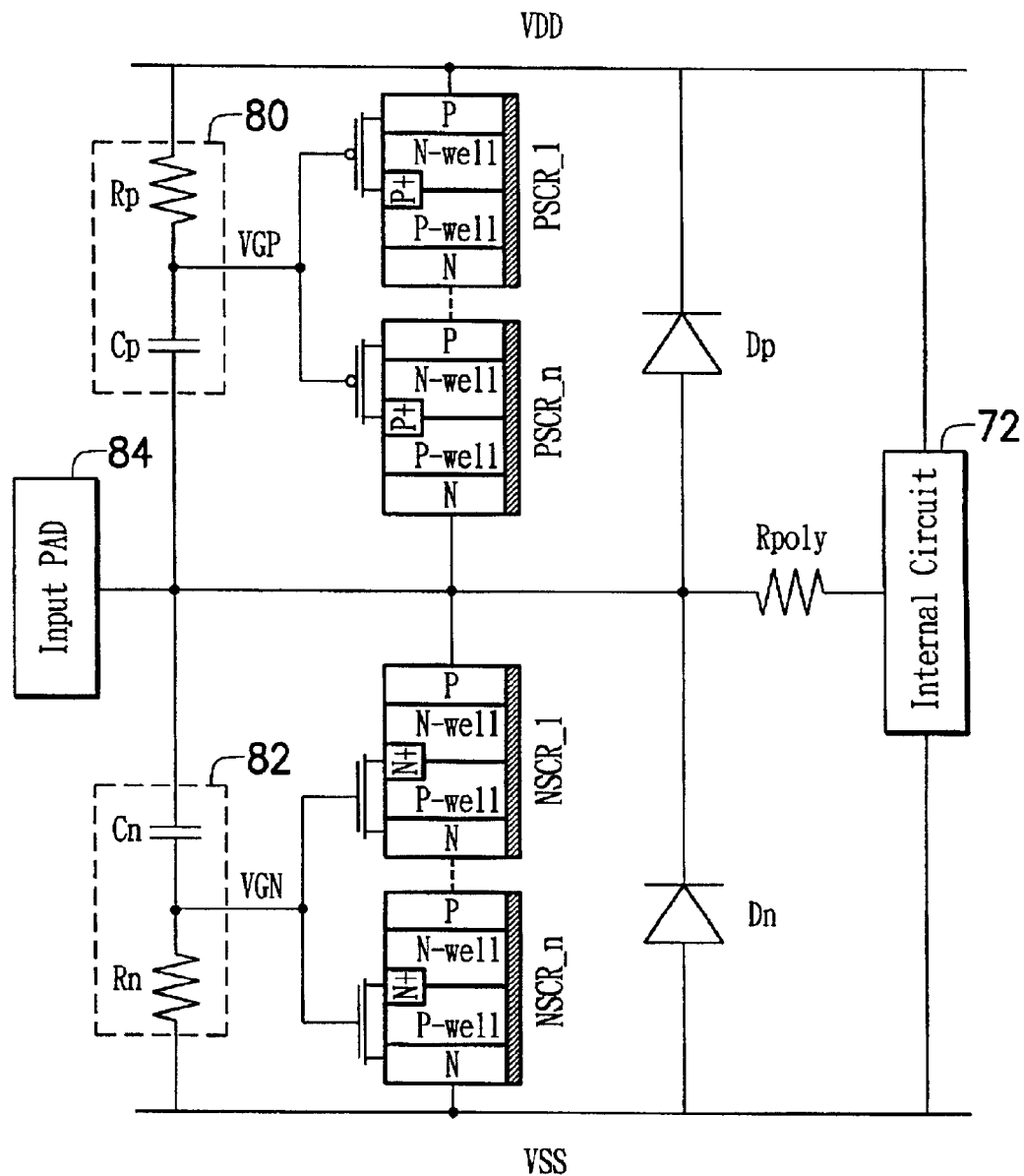
FIG. 17 is a circuit design example showing the input ESD protection circuit in FIG. 16.

The proposed NSCR/PSCR devices can also be applied to the input or output ESD protection circuit. FIG. 16 conceptually shows the design of the input ESD protection circuit with the stacked NSCR/PSCR devices. A circuit design example to realize the design of FIG. 16 is shown in FIG. 17, where the forward stacked PSCR devices (PSCR_1~PSCR_n) are configured between the input pad 84 and VDD and the forward stacked NSCR devices (NSCR_1~NSCR_n) are configured between the input pad 84 and VSS. The control gate VGN of the NSCR devices (NSCR_1~NSCR_n) is controlled by the ESD-detection circuit 82 and the control gate VGP of the PSCR devices (PSCR_1~PSCR_n) is controlled by the ESD-detection circuit 80. The coupled RC circuit in the ESD-detection circuit 80 or 82 detects ESD events. When a positive ESD voltage pulse occurs at the input pad 84 with VSS relatively grounded, sharp rising ESD voltage is coupled through the capacitor Cn to the control gate VGN of the stacked NSCR devices (NSCR_1~NSCR_n). Therefore, the stacked NSCR devices will be turned on to discharge the ESD current from the input pad 84 to VSS. On the contrary, when a negative ESD voltage pulse occurs at the input pad 84 with VDD relatively grounded, the sharply falling negative ESD voltage is coupled through the capacitor Cp to the control gate VGP of the stacked PSCR devices. Therefore, the stacked PSCR devices will be turned on to discharge the ESD current from VDD to the input pad 84. The number n of the NSCRs or PSCRs in the stacked configuration is dependent on the maximum voltage difference between the input pad 84 and VDD or the maximum voltage difference between the input pad 84 and VSS during normal operation.

Figure 18:
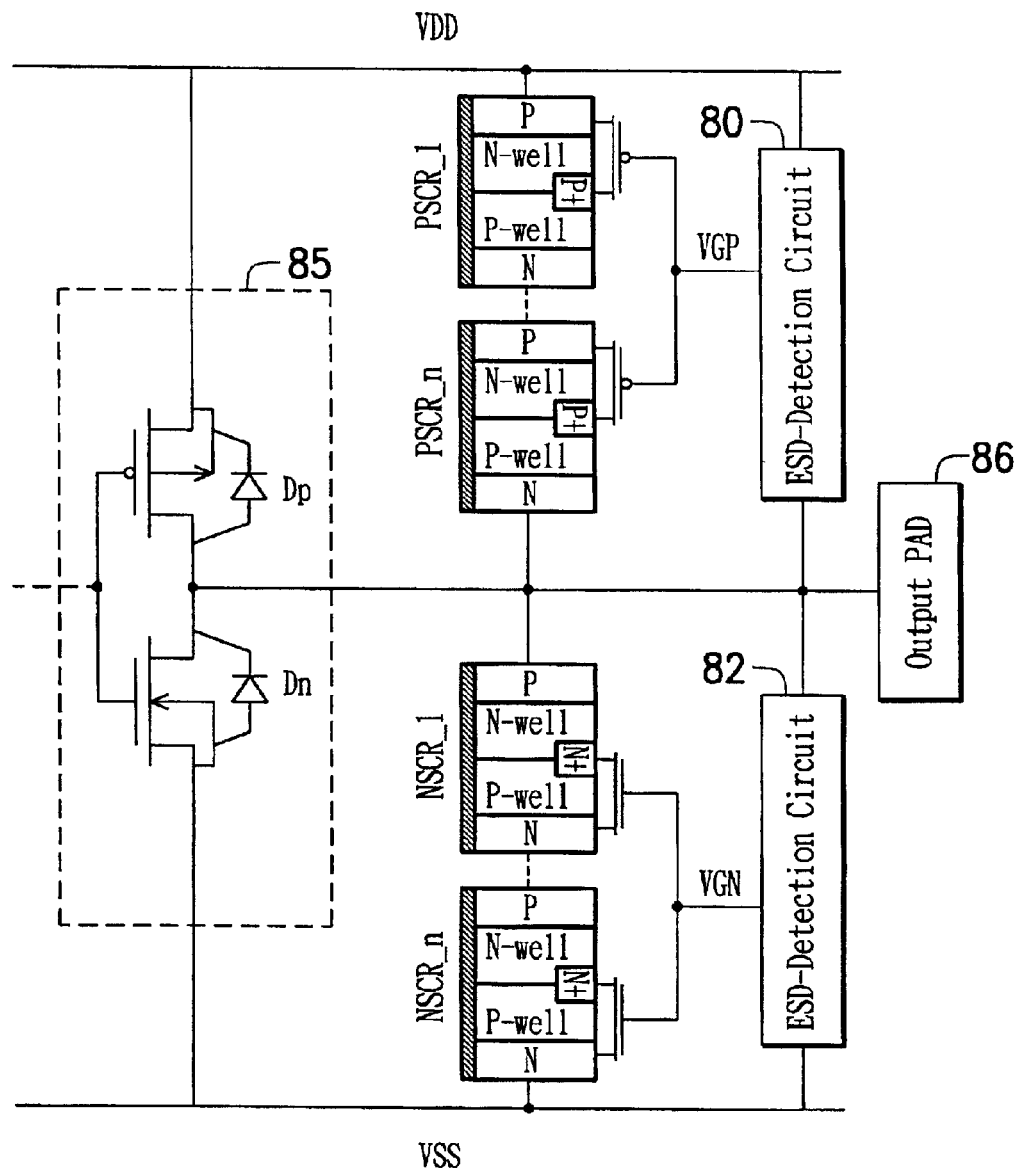
FIG. 18 shows the proposed NSCR and PSCR devices applied to the output ESD protection circuit.
Figure 19:
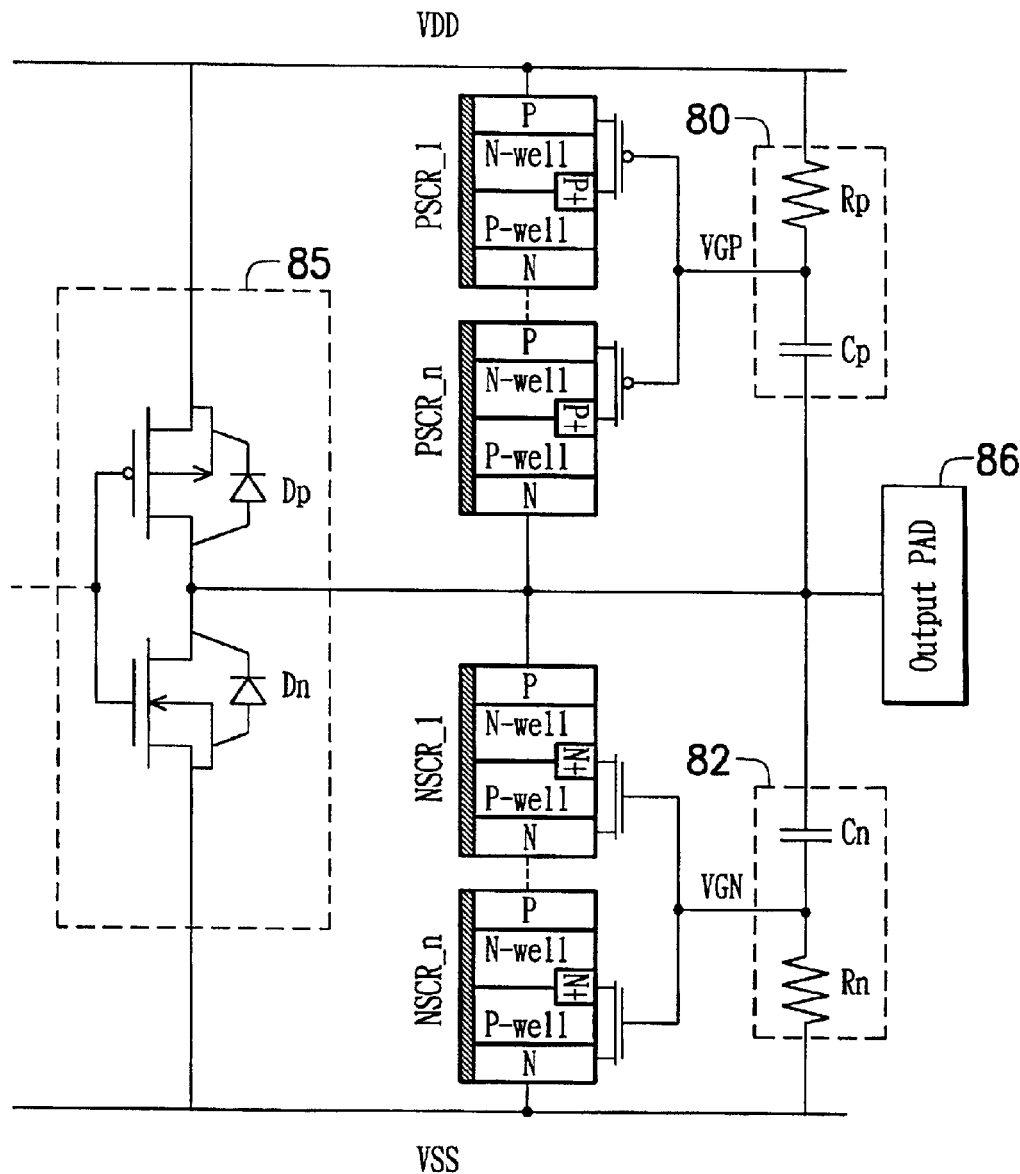
FIG. 19 is a circuit design example showing the input ESD protection circuit in FIG. 18.

The proposed NSCR or PSCR devices can also be applied to the output ESD protection circuit, as shown in FIG. 18. The circuit design example with the RC coupled circuit as the ESD-detection circuit is shown in FIG. 19. The output pad is driven by an output buffer 85. The forward stacked PSCR devices (PSCR_1~PSCR_n) are configured between the output pad 86 and VDD; the forward stacked NSCR devices (NSCR_1~NSCR_n) are forward connected between the output pad 86 and VSS. The gate VGN of the stacked NSCR devices is controlled by the ESD-detection circuit 82 and the gate VGP of the stacked PSCR devices is controlled by the ESD-detection circuit 80.

The Eleventh Embodiment

Figure 20:
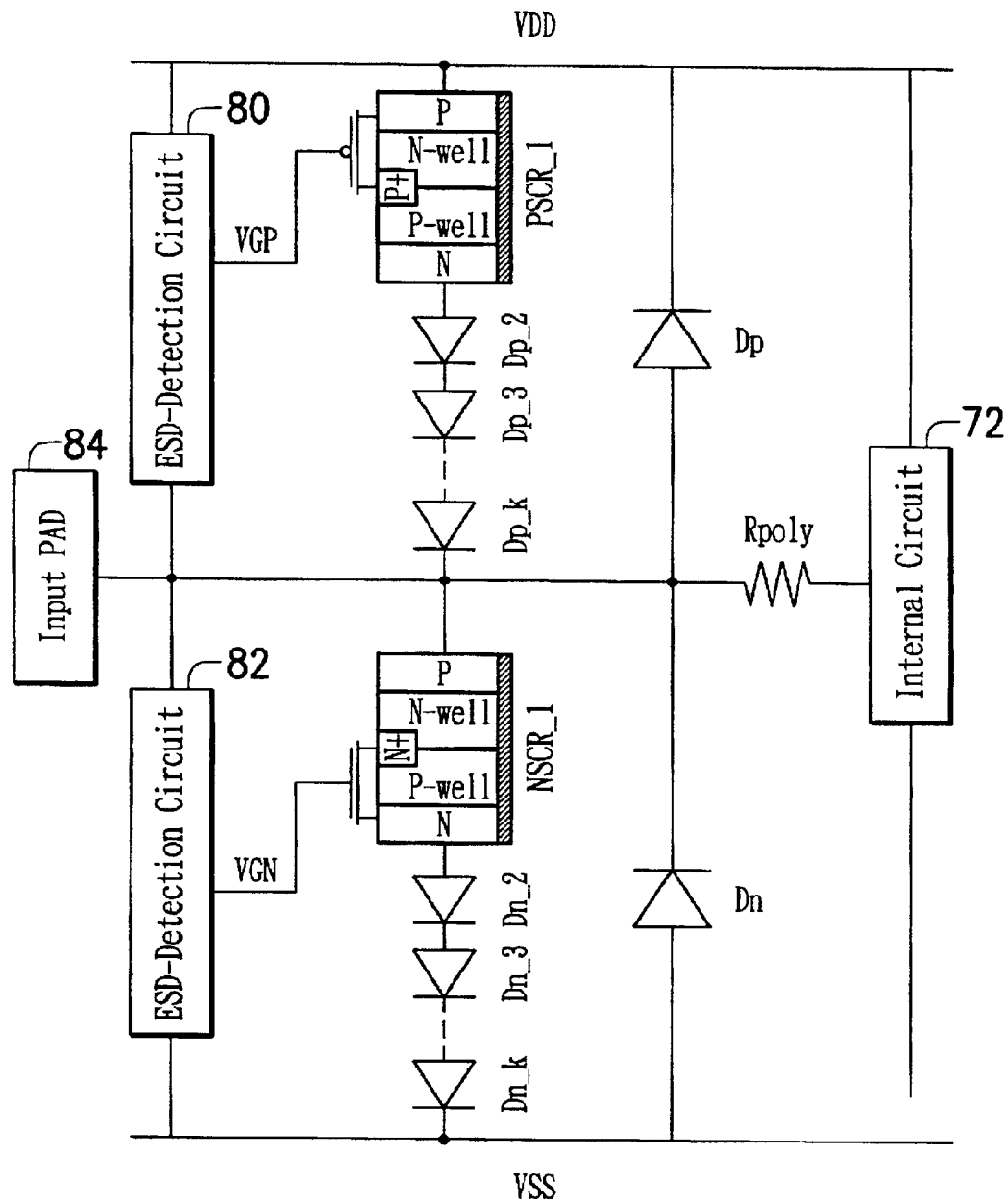
FIG. 20 shows the proposed NSCR and PSCR devices applied to the input ESD protection circuit.
Figure 21:
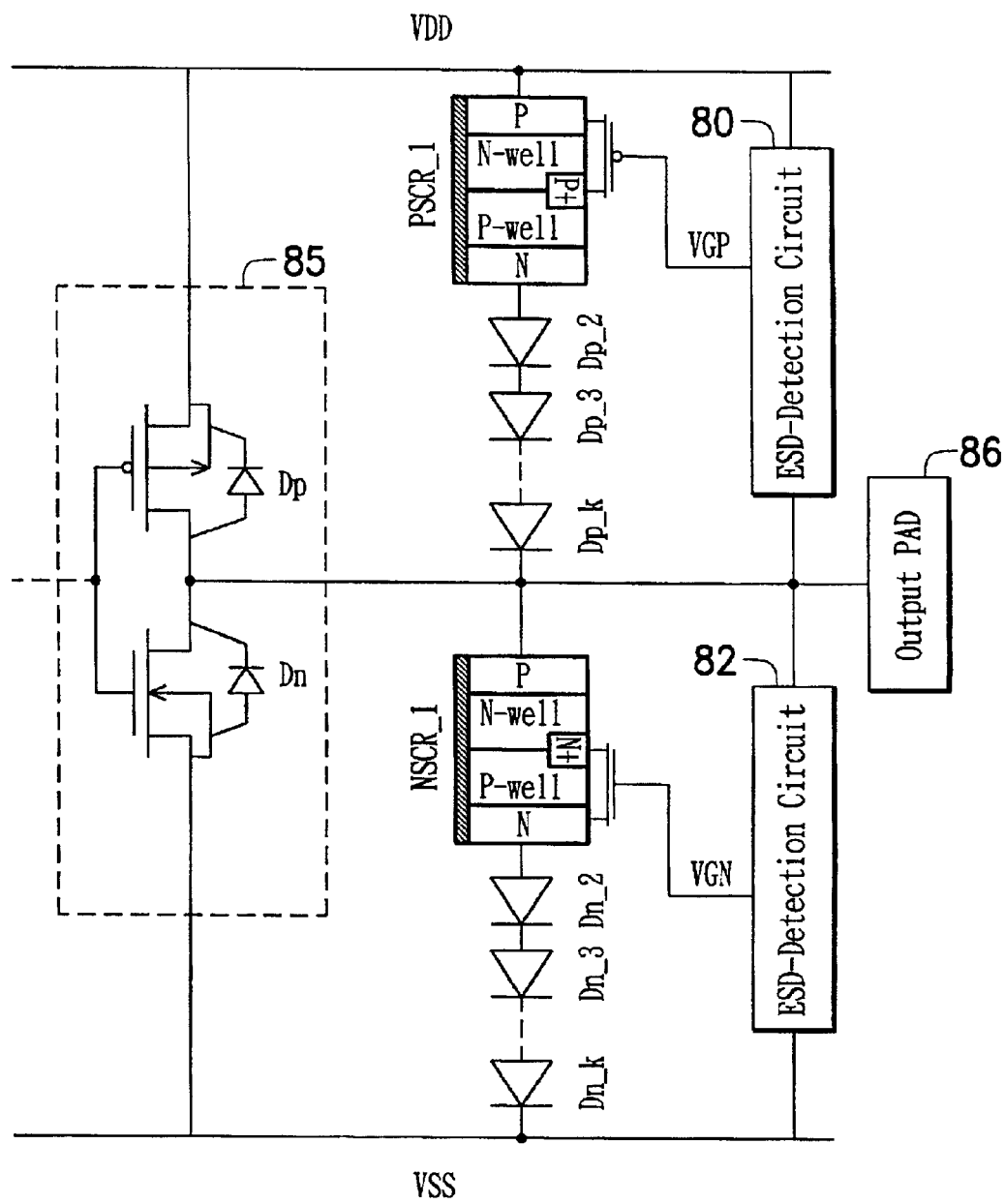
FIG. 21 is a circuit design showing the proposed NSCR and PSCR devices for output ESD protection.

The modified design with SCR-diode stacked configuration for the input ESD protection circuit is shown in FIG. 20, and for the output ESD protection circuit is shown in FIG. 21. The NSCR_1 is stacked with a plurality of diodes Dn_2~Dn_k, and the PSCR_1 is stacked with a plurality of diodes Dp_2~Dp_k. The stacked configuration can be formed by multiple SCR with multiple diodes depending on the holding voltage, but is not limited to a single NSCR, PSCR device or diode.

The Twelfth Embodiment

Figure 22:
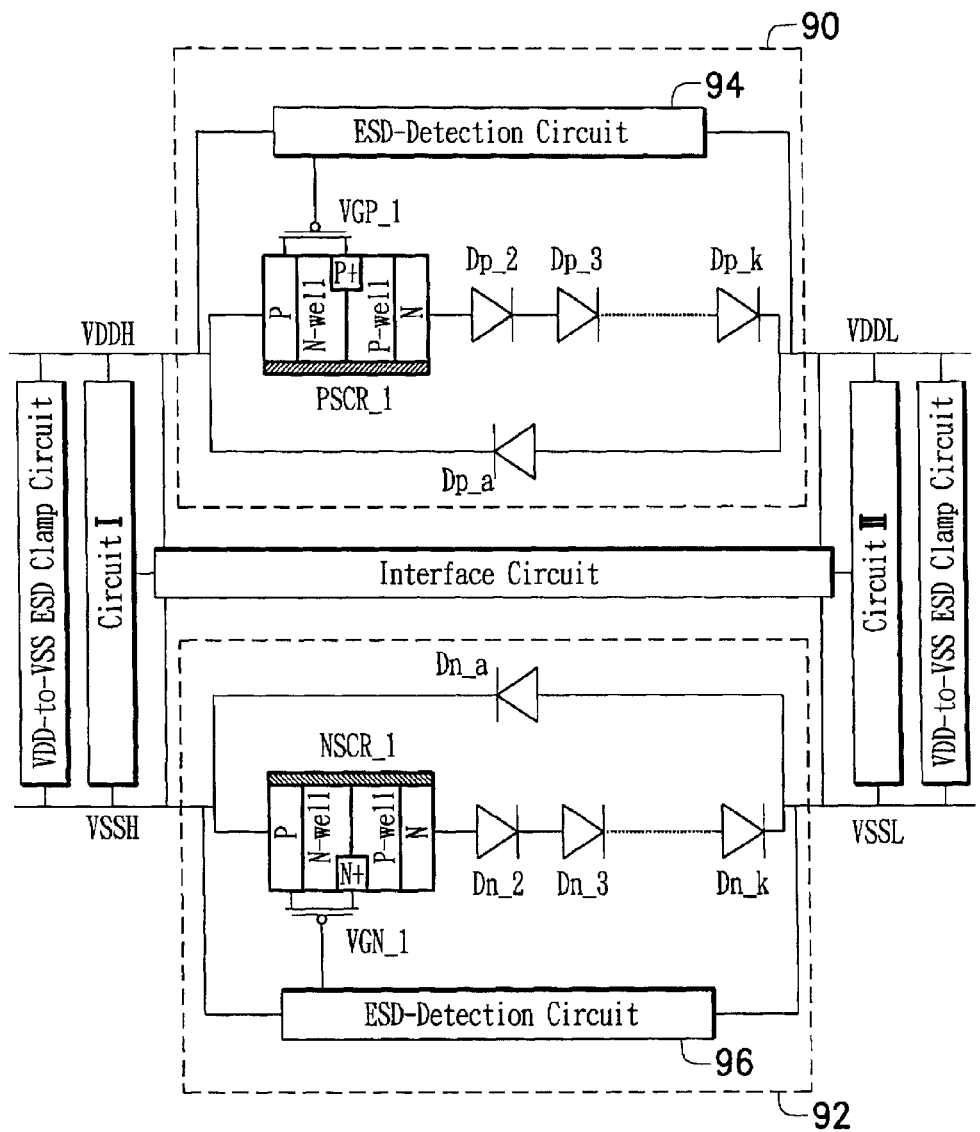
FIG. 22 shows the application of the proposed NSCR and PSCR devices with stacked diodes in the ESD protection circuit across the separated VDD (VSS) power lines.
Figure 23:
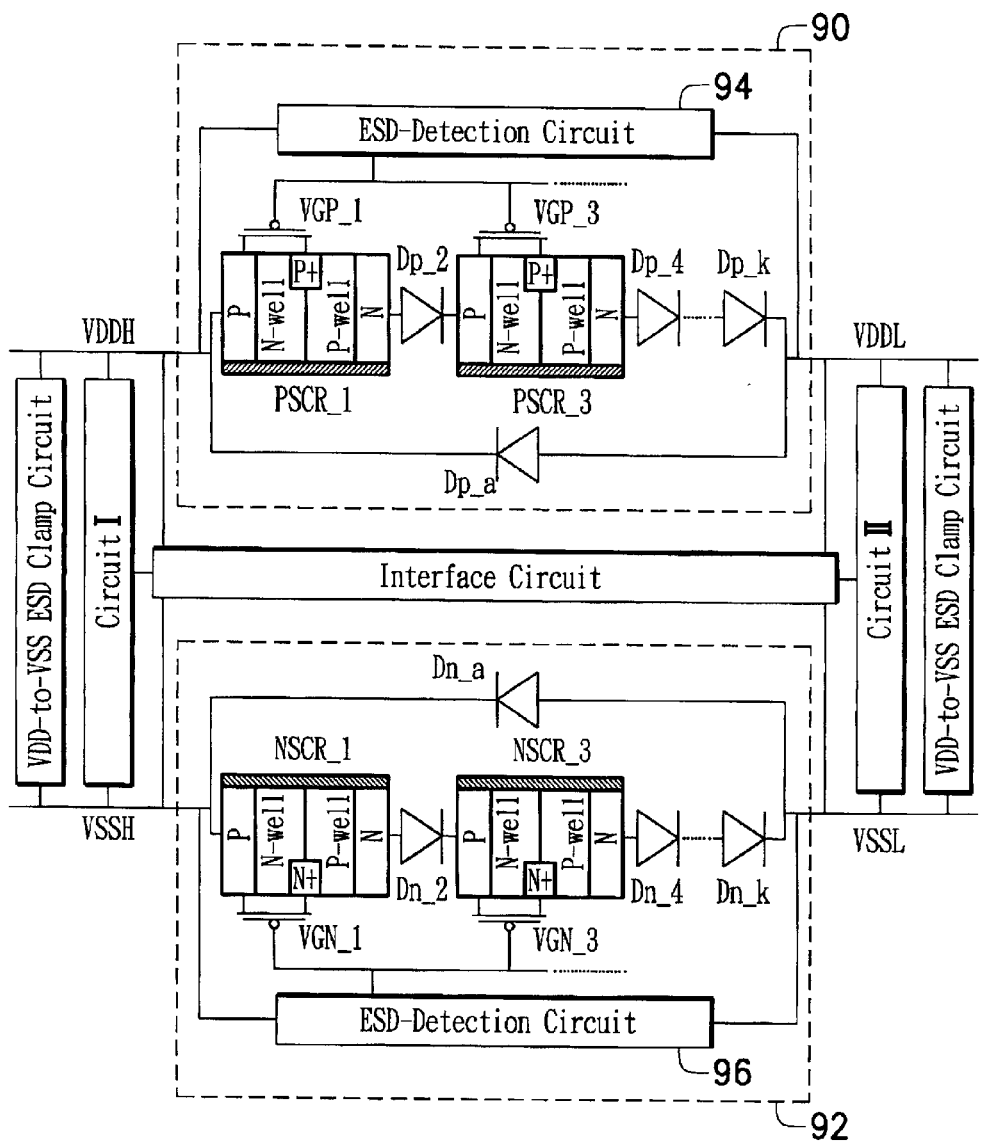
FIG. 23 shows another embodiment using the proposed NSCR and PSCR devices with stacked diodes in the ESD protection circuit across the separated VDD (VSS) power lines.

For a more comprehensive ESD protection design, an ESD clamp device is also added across separate power lines VDD (or VSS) to avoid ESD damage located at the internal circuits. The separate power lines are configured so that the noise generated from one circuit group will not interfere with the other circuit group through the power lines. However, the separated configuration of the power lines may also induce unexpected ESD damage. The ESD protection circuit must thereby be placed between the separated power lines. The applications of the proposed NSCR and PSCR devices with stacked diodes in the ESD connection circuits between the separated VDD or VSS power lines are shown in FIG. 22 and FIG. 23. The two-way ESD protection circuits 90 and 92 are placed between VDDH and VDDL, and VSSH and VSSL. In FIG. 22, a single PSCR (PSCR_1) is added into a diode string (Dp_2~Dp_k) in a stacked configuration from VDDH to VDDL to block noise or leakage current between the two separated VDD power lines. A single NSCR (NSCR_1) is added into a diode string (Dn_2~Dn_k) in a stacked configuration from VSSH to VSSL to block the noise or leakage current between these two separated VSS power lines. When a positive voltage pulse occurs at VDDH while VDDL is grounded, the ESD-detection circuit 94 sends a relatively negative voltage to the PMOS in PSCR_1 to trigger on the PSCR_1. The diode Dp_a is applied for ESD protection when a negative voltage pulse occurs at VDDH while VDDL is grounded. When a positive voltage pulse happens at VSSH while VSSL is grounded, the ESD-detection circuit 96 sends a relatively positive voltage to the NMOS in NSCR_1 to trigger on the NSCR_1. The diode Dn_a is applied for ESD protection when a negative voltage pulse occurs at VSSH while VSSL is grounded. The stacked configuration can be formed by multiple SCR with multiple diodes depending on the holding voltage, but is not limited to a single NSCR, PSCR device or diode.

The Thirteenth Embodiment

The SCR-diode stacked configuration is used to form the ESD-connection circuit between the separated VDD (or VSS) power lines in shown in FIG. 23. The two-way ESD protection circuits 90 and 92 are placed between VDDH and VDDL, and VSSH and VSSL. In FIG. 23, the PSCR devices PSCR_1 and PSCR_3 are added into a diode string (Dp_2~Dp_k) in a stacked configuration from VDDH to VDDL to block the noise or leakage current between these two separated VDD power lines. The NSCR devices NSCR_1 and NSCR_3 are added into a diode string (Dn_2~Dn_k) in a stacked configuration from VSSH to VSSL to block noise or leakage current between the two separated VSS power lines. When a positive voltage pulse happens at VDDH while VDDL is grounded, the ESD-detection circuit 94 sends a relatively negative voltage to the PMOS to trigger on the PSCR_1 and PSCR_3. The diodes Dp_a are applied for ESD protection when a negative voltage pulse occurs at VDDH while VDDL is grounded. When a positive voltage pulse happens at VSSH while VSSL is grounded, the ESD-detection circuit 96 sends a relatively positive voltage to the NMOS to trigger on the NSCR_1 and NSCR_3. The diodes Dn_a are applied for ESD protection when a negative voltage pulse happens at VSSH while VSSL is grounded. The stacked configuration can be formed by multiple SCR with multiple diodes depend on the holding voltage of the ESD protection circuit 90 or 92. If a higher noise-isolation effect is required between VDDL and VDDH, the diode or PSCR numbers have to be increased in the ESD protection circuit 90. The same principle is applied to the ESD protection circuit 92.

Compared to conventional NSCR or PSCR devices where the P-well is directly connected to the P-substrate, the NSCR or PSCR of the present invention adapts the deep N-well under the P-well to increase the resistance between the P-well and the P-substrate, or further isolate the electric connection between the P-well and the P-substrate. From the above demonstration, the proposed NSCR or PSCR devices with the deep N-well structure are more suitable for stacked configuration in the ESD protection circuits. The ESD protection capability of the on-chip ESD protection circuits in CMOS IC's can therefore be effectively improved by the proposed NSCR or PSCR devices.

Finally, while the invention has been described by way of examples and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An ESD protection circuit, located on a substrate of a first conductivity type, comprising:
   a lateral silicon controlled rectifier (SCR), comprising:
     a P-type layer, as an anode of the SCR; an N-type layer, as a cathode of the SCR;
     a first N-well, located between the P-type layer and the N-type layer, contacted with the P-type layer; and
     a first P-well, contacted to the first N-well and the N-type layer; and
   a deep well of a second conductivity type, located between the lateral SCR and the substrate, for isolating the electric connection between the substrate and the lateral SCR, wherein the deep well is connected to a fix-biased N-well and coupled to a relatively high voltage power source.

2. The ESD protection component as claimed in claim 1, wherein the N-type layer is formed by a first N-type diffusion in the first P-well.

3. The ESD protection component as claimed in claim 1, wherein the first P-well is coupled to the cathode.

4. The ESD protection component as claimed in claim 1, wherein the lateral SCR is an N-type SCR (N-type silicon rectifier, NSCR).

5. The ESD protection component as claimed in claim 1, wherein the lateral SCR is a P-type SCR (P-type silicon rectifier, PSCR).

6. The ESD protection component as claimed in claim 1, wherein the P-type layer is located in the first N-well.

7. The ESD protection circuit as claimed in claim 1, wherein the substrate is an N-substrate and the deep well is a deep P-well.

8. The ESD protection component as claimed in claim 1, wherein the substrate is a P-substrate and the deep well is a deep N-well.

9. The ESD protection component as claimed in claim 8, wherein the fixed-biased N-well, the deep N-well and the first N-well electrically isolate the first P-well and the P-substrate.

10. The ESD protection component as claimed in claim 8, wherein the fixed-biased N-well, the deep N-well and the first N-well electrically isolate the P-type layer and the P-substrate.

11. The ESD protection component as claimed in claim 8, wherein the fixed-biased N-well encloses the lateral SCR.

12. The ESD protection component as claimed in claim 8, wherein the N-type layer comprises a second N-well, the deep N-well comprises a separated first deep N-well and second deep N-well, respectively abutting the first N-well and the second N-well.

13. An ESD protection circuit, coupled between a first connection pad and a second connection pad, comprising:
   an ESD protection component, having an anode and a cathode, located on a substrate of a first conductivity type, comprising:
      a lateral SCR, comprising:
         a P-type layer, as the anode of the SCR;
         a N-type layer, as the cathode of the SCR;
         a first N-well, located between the P-type layer and the N-type layer, contacted with the P-type layer; and
         a first P-well, contacted to the first N-well and the N-type layer; and
      a deep well of a second conductivity type, located between the lateral SCR and the substrate, for isolating the electric connection between the lateral SCR and the substrate, wherein the deep well is connected to a fix-biased well and coupled to a power rail;
   wherein the anode and the cathode are coupled to the first connection pad and the second connection pad, respectively.

14. The ESD protection circuit as claimed in claim 13, wherein the substrate is a P-substrate coupled to a relatively low power rail, and the deep well is a deep N-well coupled to a relatively high power rail.

15. The ESD protection circuit as claimed in claim 13, wherein the substrate is a N-substrate coupled to a relatively high power rail, and the deep well is a deep P-well coupled to a relatively low power rail.

16. The ESD protection circuit as claimed in claim 13, wherein the ESD protection circuit further comprises a diode, coupled between the first connection pad and the second connection pad, and forward stacked with the lateral SCR.

17. The ESD protection circuit as claimed in claim 13, wherein the lateral SCR is an NSCR, and the ESD protection circuit further comprises an ESD-detection circuit providing a trigger voltage to a control gate of the NSCR at the occurrence of the ESD event to trigger on the NSCR.

18. The ESD protection circuit as claimed in claim 17, wherein the ESD-detection circuit comprises a RC circuit, for detecting an ESD event.

19. The ESD protection circuit as claimed in claim 13, wherein the lateral SCR is a PSCR, and the ESD protection circuit further comprises an ESD-detection circuit providing a trigger voltage to a control gate of the PSCR at the occurrence of the ESD event to trigger on the PSCR.

20. The ESD protection circuit as claimed in claim 19, wherein the ESD-detection circuit comprises a RC circuit, for detecting an ESD event.

21. The ESD protection circuit as claimed in claim 13, wherein the first connection pad is used as an input of a relatively high-voltage power source, and the second connection pad is used as an input of the relatively low-voltage power source.

22. The ESD protection circuit as claimed in claim 13, wherein the first connection pad is used as a high voltage power pad, and the second connection pad is used as an I/O pad.

23. The ESD protection circuit as claimed in claim 13, wherein the first connection pad is used as an I/O pad, and the second connection pad is used as a low voltage power pad.

24. The ESD protection circuit as claimed in claim 13, wherein the first connection pad is a high voltage power pad, and the second connection pad is a low voltage power pad.

25. The ESD protection circuit as claimed in claim 13, wherein the ESD protection circuit further comprises an inverted ESD protection component, having an anode coupled to the second connection pad and a cathode coupled to the first connection pad.

26. The ESD protection circuit as claimed in claim 13, wherein the ESD protection circuit comprises a plurality of ESD protection components, forwardly stacked between the first connection pad and the second connection pad for preventing from latch-up problem.

* * * * *